(12) United States Patent
Jeong

(10) Patent No.: US 12,080,242 B2
(45) Date of Patent: Sep. 3, 2024

(54) DISPLAY DEVICE OPERABLE IN DIFFERENT DISPLAY MODES

(71) Applicant: Samsung Display Co., LTD., Yongin-si (KR)

(72) Inventor: Jun Ki Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/749,070

(22) Filed: May 19, 2022

(65) Prior Publication Data
US 2023/0027673 A1 Jan. 26, 2023

(30) Foreign Application Priority Data
Jul. 26, 2021 (KR) .......................... 10-2021-0098161

(51) Int. Cl.
*G09G 3/3266* (2016.01)
*G09G 3/3225* (2016.01)
(Continued)

(52) U.S. Cl.
CPC ......... *G09G 3/3266* (2013.01); *G09G 3/3225* (2013.01); *G09G 3/3241* (2013.01); *G09G 5/008* (2013.01); *G09G 5/18* (2013.01); *G09G 2230/00* (2013.01); *G09G 2300/0426* (2013.01); *G09G 2300/08* (2013.01); *G09G 2300/0842* (2013.01); *G09G 2310/0202* (2013.01);
(Continued)

(58) Field of Classification Search
CPC .. G09G 3/3266; G09G 3/3225; G09G 3/3241; G09G 5/008; G09G 5/18; G09G 2230/00; G09G 2300/0426; G09G 2300/08; G09G 2300/0842; G09G 2310/0202; G09G 2310/0216; G09G 2310/08; G09G 2320/0223; G09G 2320/0686; G09G 2330/021; G09G 2340/0435; G09G 2340/0442; G11C 19/28
See application file for complete search history.

(56) References Cited

U.S. PATENT DOCUMENTS

| | | | |
|---|---|---|---|
| 2012/0212517 A1 | 8/2012 | Ahn | |
| 2014/0198085 A1* | 7/2014 | Park | G09G 3/3233 345/212 |

(Continued)

FOREIGN PATENT DOCUMENTS

| | | |
|---|---|---|
| KR | 10-1871188 | 8/2012 |
| KR | 10-2138664 | 7/2020 |
| KR | 10-2021-0054114 | 5/2021 |

*Primary Examiner* — Adam J Snyder
(74) *Attorney, Agent, or Firm* — CANTOR COLBURN LLP

(57) ABSTRACT

A display device includes a pixel unit including first pixels disposed in a first area and second pixels disposed in a second area, an emission driver configured to sequentially supply emission signals of a turn-off level to the first pixels and the second pixels based on a first start signal, a first clock signal, and a second clock signal, and a first scan driver configured to sequentially supply first scan signals of a turn-on level to the first pixels based on a second start signal, the first clock signal, and the second clock signal, and sequentially supply the first scan signals of the turn-on level to the second pixels based on a third start signal, the first clock signal, and the second clock signal.

20 Claims, 15 Drawing Sheets

(51) Int. Cl.
  *G09G 3/3241*  (2016.01)
  *G09G 5/00*   (2006.01)
  *G09G 5/18*   (2006.01)
  *G11C 19/28*  (2006.01)

(52) U.S. Cl.
  CPC . *G09G 2310/0216* (2013.01); *G09G 2310/08* (2013.01); *G09G 2320/0223* (2013.01); *G09G 2320/0686* (2013.01); *G09G 2330/021* (2013.01); *G09G 2340/0435* (2013.01); *G09G 2340/0442* (2013.01); *G11C 19/28* (2013.01)

(56) References Cited

U.S. PATENT DOCUMENTS

| | | | |
|---|---|---|---|
| 2014/0333513 A1* | 11/2014 | Park | G09G 3/3266 345/76 |
| 2018/0075803 A1* | 3/2018 | Lee | G09G 3/3266 |
| 2018/0293939 A1* | 10/2018 | Kim | G09G 3/3266 |
| 2019/0340977 A1* | 11/2019 | Park | G09G 3/3266 |
| 2020/0211469 A1* | 7/2020 | Jeon | G09G 3/3266 |
| 2021/0134210 A1 | 5/2021 | In et al. | |
| 2021/0358384 A1* | 11/2021 | Liu | G09G 3/3266 |
| 2021/0407409 A1* | 12/2021 | Zheng | G09G 3/3266 |

* cited by examiner

DISPLAY DEVICE OPERABLE IN DIFFERENT DISPLAY MODES

CROSS REFERENCE TO RELATED APPLICATION

This application claims priority from and the benefit of Korean Patent Application No. 10-2021-0098161, filed on Jul. 26, 2021, which is hereby incorporated by reference for all purposes as if fully set forth herein.

BACKGROUND

Field

Embodiments of the invention relate generally to a display device and more specifically, to a display device operating in different display modes.

Discussion of the Background

With development of information technology, importance of a display device, which is a connection medium between a user and information, has been increased. In response to this, usage of a display device such as a liquid crystal display device and an organic light emitting display device has been broadened.

In order to reduce power consumption, the display device may display an image at a high image frequency in some areas and display an image at a low image frequency in other areas. Thus, additional scan drivers and emission drivers have been required to operate the different areas at the different image frequencies. As a result, a dead space, which is caused by the additional scan drivers and emission drivers, has been increased.

The above information disclosed in this Background section is only for understanding of the background of the inventive concepts, and, therefore, it may contain information that does not constitute prior art.

SUMMARY

Display devices constructed according to the principles of the invention are capable of minimizing a dead space by reducing the sizes of scan drivers and/or emission drivers and operating two or more areas to display images at different image frequencies.

Additional features of the inventive concepts will be set forth in the description which follows, and in part will be apparent from the description, or may be learned by practice of the inventive concepts.

According to an aspect of the invention, a display device includes a pixel unit including first pixels positioned in a first area and second pixels positioned in a second area, an emission driver configured to sequentially supply emission signals of a turn-off level to the first pixels and the second pixels based on a first start signal, a first clock signal, and a second clock signal, and a first scan driver configured to sequentially supply first scan signals of a turn-on level to the first pixels based on a second start signal, the first clock signal, and the second clock signal, and sequentially supply the first scan signals of the turn-on level to the second pixels based on a third start signal, the first clock signal, and the second clock signal.

The display device may further include a second scan driver configured to sequentially supply second scan signals of a turn-on level to the first pixels based on a fourth start signal, a third clock signal, and a fourth clock signal, and sequentially supply the second scan signals of the turn-on level to the second pixels based on a fifth start signal, the third clock signal, and the fourth clock signal.

The display device may further include a third scan driver configured to sequentially supply third scan signals of a turn-on level to the first pixels and the second pixels based on a sixth start signal, a fifth clock signal, and a sixth clock signal.

Each of the first pixels and each of the second pixels may include a first transistor having a gate electrode connected to a first node, a first electrode connected to a second node, and a second electrode connected to a third node, a second transistor having a gate electrode to receive one of the third scan signals, a first electrode connected to a data line, and a second electrode connected to the second node, a third transistor having a gate electrode to receive one of the second scan signals, a first electrode connected to the first node, and a second electrode connected to the third node, a fourth transistor having a gate electrode to receive one of the first scan signals, a first electrode connected to the first node, and a second electrode connected to a first initialization line, and a fifth transistor having a gate electrode to receive one of the emission signals, a first electrode connected to a first power line, and a second electrode connected to the second node.

Each of the first pixels and each of the second pixels may further include a sixth transistor having a gate electrode to receive one of the emission signals, a first electrode connected to the third node, and a second electrode, a seventh transistor having a gate electrode to receive one of the third scan signals, a first electrode connected to a second initialization line, and a second electrode, a light emitting element having a first electrode connected to the second electrode of the sixth transistor and the second electrode of the seventh transistor, and a second electrode connected to a second power line, and a capacitor having a first electrode connected to the first power line and a second electrode connected to the first node.

The first transistor, the second transistor, the fifth transistor, the sixth transistor, and the seventh transistor may be P-type transistors, and the third transistor and the fourth transistor may be N-type transistors.

The emission driver may include a plurality of emission stages, each of the plurality of emission stages may be connected to N pixel rows, wherein N may be an integer greater than 3.

The first scan driver may include a plurality of first scan stages, and each of the plurality of first scan stages may be connected to the N pixel rows.

The second scan driver may include a plurality of second scan stages, each of the plurality of second scan stages may be connected to M pixel rows, wherein M may be an integer greater than 1 and less than N.

The third scan driver may include a start stage and a plurality of third scan stages, each of the plurality of third scan stages may be connected to the M pixel rows, and a number of the third scan stages may be greater than a number of the second scan stages.

When the first area and the second area display an image at a same image frequency, cycles of the second start signal and the third start signal may be the same as each other.

When the first area and the second area display images of different image frequencies, the cycles of the second start signal and the third start signal may be different from each other.

When the first area and the second area display images of a same image frequency, cycles of the fourth start signal and the fifth start signal may be same as each other.

When the first area and the second area display images of different image frequencies, the cycles of the fourth start signal and the fifth start signal may be different from each other.

According to another aspect of the invention, a display device includes a pixel unit including a plurality of pixel rows, an emission driver including a plurality of emission stages each connected to N pixel rows, wherein N is an integer greater than 3, a first scan driver including a plurality of first scan stages each connected to the N pixel rows, a second scan driver including a plurality of second scan stages each connected to M pixel rows, wherein M is an integer greater than 1 and less than N; and a third scan driver including a start stage and a plurality of third scan stages each connected to the M pixel rows.

A number of the third scan stages may be greater than a number of the second scan stages.

The start stage of the third scan driver may be connected to one pixel row.

The emission driver may receive a first start signal, a first clock signal, and a second clock signal.

The first scan driver may receive a second start signal, a third start signal, the first clock signal, and the second clock signal.

The second scan driver may receive a fourth start signal, a fifth start signal, a third clock signal, and a fourth clock signal.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
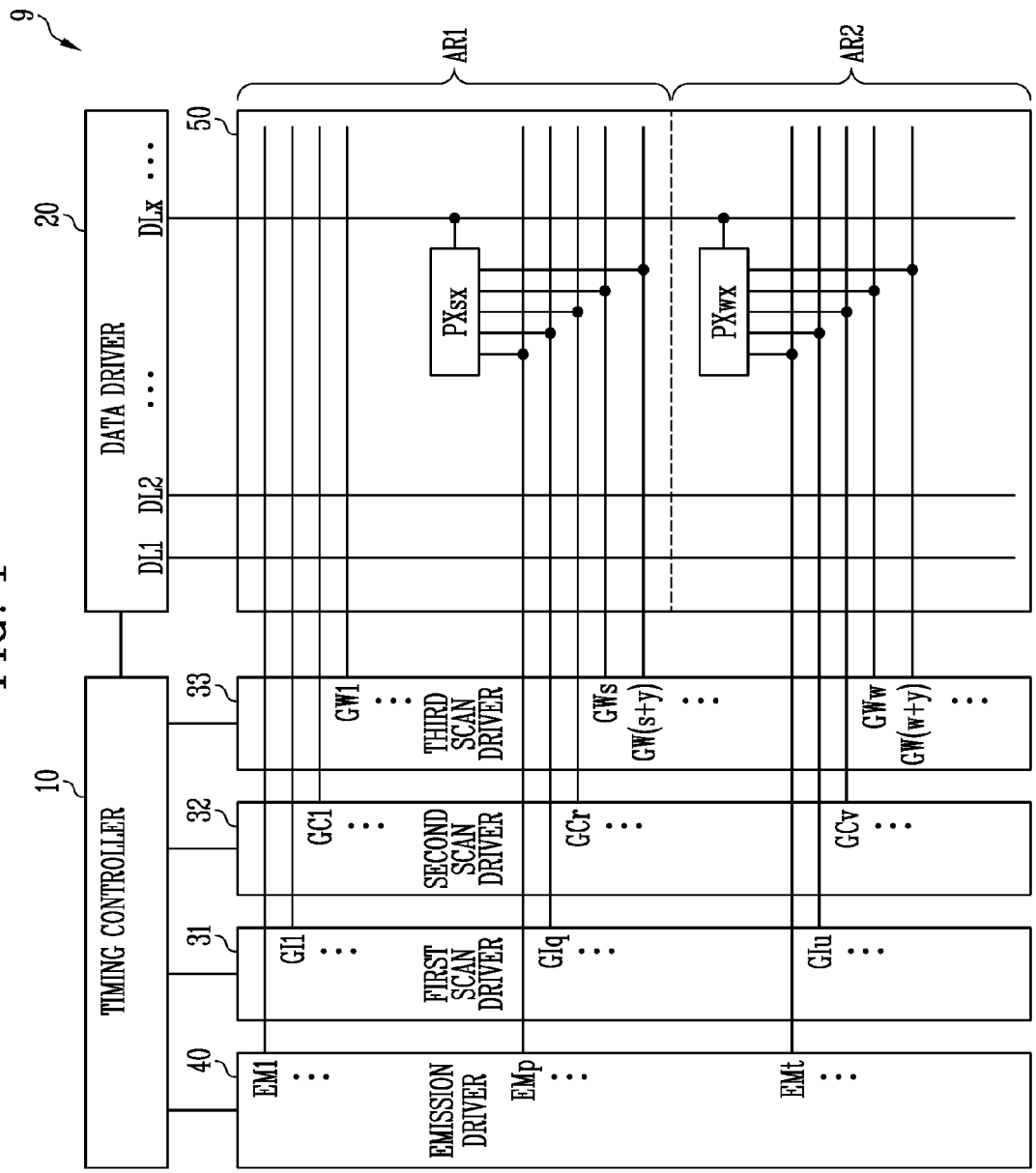
FIG. 1 is a schematic diagram of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In addition, an expression "is the same" in the description may mean "is substantially the same". That is, the expression "is the same" may be the same enough for those of ordinary skill to understand that it is the same. Other expressions may also be expressions in which "substantially" is omitted.

FIG. 1 is a diagram illustrating a display device according to an embodiment.

Referring to FIG. 1, the display device 9 according to an embodiment may include a timing controller 10, a data driver 20, a first scan driver 31, a second scan driver 32, a third scan driver 33, an emission driver 40, and a pixel unit 50.

The timing controller 10 may receive a timing signal for each frame and grayscale levels from a processor. The timing signal may include a vertical synchronization signal, a horizontal synchronization signal, and a data enable signal.

The vertical synchronization signal may include a plurality of pulses, and may indicate that a previous frame period is ended and a current frame period is started based on a time point at which each of pulses is generated. An interval between adjacent pulses of the vertical synchronization signal may correspond to one frame period. The horizontal synchronization signal may include a plurality of pulses, and may indicate that a previous horizontal period is ended and a new horizontal period is started based on a time point at which each of pulses is generated. An interval between adjacent pulses of the horizontal synchronization signal may correspond to one horizontal period. The data enable signal may indicate that grayscale levels are supplied during the horizontal period. For example, the grayscale levels may be supplied during a pixel row unit in each horizontal period in response to the data enable signal.

The timing controller 10 may generate control signals, which are supplied to the data driver 20, the first scan driver 31, the second scan driver 32, the third scan driver 33, the emission driver 40, and the like.

The data driver 20 may generate data voltages, which are provided to data lines DL1, DL2, and DLx, based on the grayscale levels and the control signals received from the timing controller 10. For example, the data driver 20 may sample the grayscale levels by using a clock signal, and supply the data voltages corresponding to the grayscale levels to the data lines DL1, DL2, and DLx in a pixel row unit.

The pixel unit 50 may include first pixels positioned in a first area AR1 and second pixels positioned in a second area AR2. In an embodiment, referring to FIG. 16, a pixel unit 50' may include three or more areas. Each pixel may be connected to a corresponding data line, a corresponding emission line, a corresponding first scan line, a corresponding second scan line, and a corresponding third scan line. For example, a first pixel PXsx may be connected to an x-th data line DLx, a p-th emission line EMp, a q-th first scan line GIq, an r-th second scan line GCr, an s-th third scan line GWs, and an (s+y)-th third scan line GW(s+y). A pixel row may refer to pixels connected to the same scan lines and the same emission lines. For example, the first pixel PXsx may be included in a pixel row of pixels connected to the p-th emission line Emp, the q-th first scan line GIq, the r-th second scan line GCr, the s-th third scan line GWs, and the (s+y)-th third scan line GW(s+y). The pixels included in the pixel row may be connected to different data lines. In an embodiment, a second pixel PXwx may be connected to the x-th data line DLx, a t-th emission line EMt, a u-th first scan line GIu, a v-th second scan line GCv, a w-th third scan line GWw, and a (w+y)-th third scan line GW(w+y). Here, p, q, r, s, x, and y may be integers greater than zero, and T, u, v, and w may be integers greater than 1.

The emission driver 40 may generate emission signals, which are supplied to emission lines EM1, EMp, and EMt by receiving the control signals from the timing controller 10. At this time, the control signals may include a first start signal, a first clock signal, and a second clock signal. The emission driver 40 may include a shift register based on the first start signal, the first clock signal, and the second clock signal. The emission driver 40 may sequentially supply the emission signals of a turn-off level to the first pixels and the second pixels according to the first start signal, the first clock signal, and the second clock signal.

The first scan driver 31 may generate first scan signals, which are supplied to first scan lines GI1, GIq and GIu by receiving the control signals from the timing controller 10. At this time, the control signals may include a second start signal, a third start signal, the first clock signal, and the second clock signal. For example, the first scan driver 31 and the emission driver 40 may share the first clock signal and the second clock signal. Thus, additional clock lines may not be required, and a dead space may be reduced. The first scan driver 31 may include a first circuit unit, which is controlled by the second start signal, the first clock signal, and the second clock signal, and a second circuit unit, which is controlled by the third start signal, the first clock signal, and the second clock signal. Each of the first circuit unit and the second circuit unit may be configured of shift registers. The first circuit unit of the first scan driver 31 may sequentially supply first scan signals of a turn-on level to the first pixels according to the second start signal, the first clock signal, and the second clock signal. For example, the second circuit unit of the first scan driver 31 may sequentially supply the first scan signals of the turn-on level to the second pixels according to the third start signal, the first clock signal, and the second clock signal.

The second scan driver 32 may generate second scan signals, which are supplied to second scan lines GC1, GCr, and GCv, based on the control signals received from the timing controller 10. At this time, the control signals may include a fourth start signal, a fifth start signal, a third clock signal, and a fourth clock signal. The second scan driver 32 may include a third circuit unit controlled by the fourth start signal, the third clock signal, and the fourth clock signal, and a fourth circuit unit controlled by the fifth start signal, the third clock signal, and the fourth clock signal. Each of the third circuit unit and the fourth circuit unit may be configured of shift registers. The third circuit unit of the second scan driver 32 may sequentially supply second scan signals of a turn-on level to the first pixels according to the fourth start signal, the third clock signal, and the fourth clock signal. For example, the fourth circuit unit of the second scan driver 32 may sequentially supply the second scan signals of the turn-on level to the second pixels according to the fifth start signal, the third clock signal, and the fourth clock signal.

The third scan driver 33 may generate third scan signals, which are supplied to third scan lines GW1, GWs, GW(s+y), GWw, and GW(w+y), according to the control signals received from the timing controller 10. At this time, the control signals may include a sixth start signal, a fifth clock signal, and a sixth clock signal. The third scan driver 33 may include a shift register controlled by the sixth start signal, the fifth clock signal, and the sixth clock signal. The third scan driver 33 may sequentially supply the third scan signals of a turn-on level to the first pixels and the second pixels based on the sixth start signal, the fifth clock signal, and the sixth clock signal.

Figure 2:
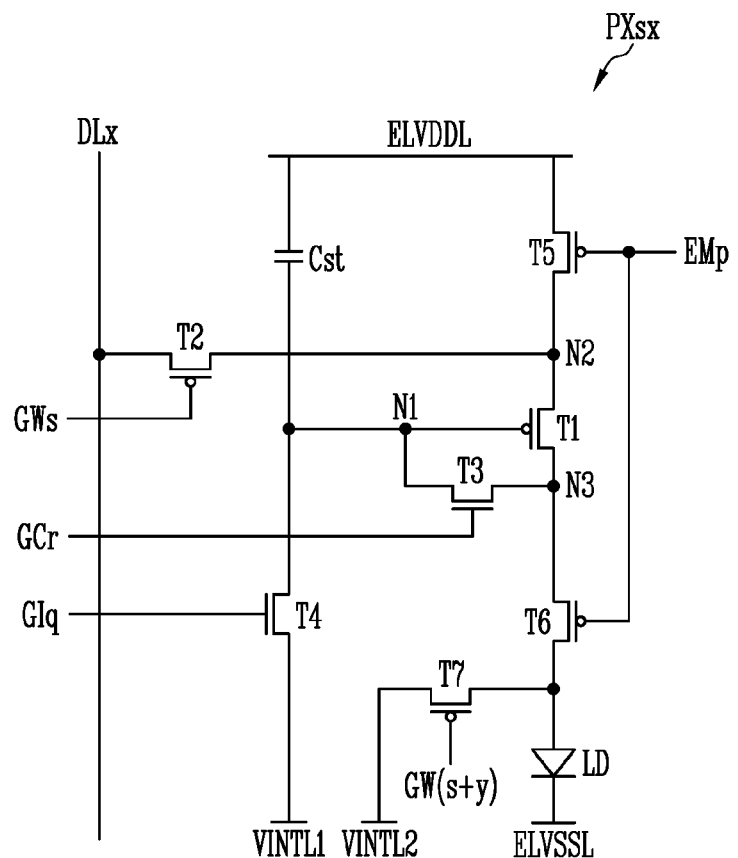
FIG. 2 is a schematic diagram of a representative pixel of the display device of FIG. 1.

FIG. 2 is a diagram illustrating a pixel according to an embodiment.

Referring to FIG. 2, the first pixel PXsx according to an embodiment includes transistors T1, T2, T3, T4, T5, T6, and T7, a capacitor Cst, and a light emitting element LD. Since the second pixel PXwx is configured to be substantially identical to the first pixel PXsx, a repetitive description is omitted for descriptive convenience.

The first transistor T1 may have a gate electrode connected to a first node N1, a first electrode connected to a second node N2, and a second electrode connected to a third node N3. The first transistor T1 may be referred to as a driving transistor.

The second transistor T2 may have a gate electrode for receiving one of the third scan signals, a first electrode connected to the data line DLx, and a second electrode connected to the second node N2. The gate electrode of the second transistor T2 may be connected to the third scan line GWs. The second transistor T2 may be referred to as a scan transistor.

The third transistor T3 may have a gate electrode for receiving one of the second scan signals, a first electrode connected to the first node N1, and a second electrode connected to the third node N3. The gate electrode of the third transistor T3 may be connected to the second scan line GCr. The third transistor T3 may be referred to as a diode connection transistor.

The fourth transistor T4 may have a gate electrode for receiving one of the first scan signals, a first electrode connected to the first node N1, and a second electrode connected to a first initialization line VINTL1. The gate electrode of the fourth transistor T4 may be connected to the first scan line GIq. The fourth transistor T4 may be referred to as a gate initialization transistor.

The fifth transistor T5 may have a gate electrode for receiving one of the emission signals, a first electrode connected to a first power line ELVDDL, and a second electrode connected to the second node N2. The gate electrode of the fifth transistor T5 may be connected to the emission line EMp. The fifth transistor T5 may be referred to as a first emission transistor.

The sixth transistor T6 may have a gate electrode for receiving one of the emission signals, a first electrode connected to the third node N3, and a second electrode. The gate electrode of the sixth transistor T6 may be connected to the emission line EMp. The sixth transistor T6 may be referred to as a second emission transistor.

The seventh transistor T7 may have a gate electrode for receiving one of the third scan signals, a first electrode connected to a second initialization line VINTL2, and a second electrode. The gate electrode of the seventh transistor T7 may be connected to the third scan line GW(s+y). The seventh transistor T7 may be referred to as an anode initialization transistor. In another embodiment, the gate electrode of the seventh transistor T7 may be connected to the third scan line GWs.

The capacitor Cst may have a first electrode connected to the first power line ELVDDL and a second electrode connected to the first node N1.

In the light emitting element LD, the first electrode (for example, an anode) may be connected to the second electrode of the sixth transistor T6 and the second electrode of the seventh transistor T7, and the second electrode (for example, a cathode) may be connected to second power line ELVSSL. During an emission period of the light emitting element LD, a voltage applied to the second power line ELVSSL may be set to be lower than a voltage applied to the first power line ELVDDL. The light emitting element LD may be configured of an organic light emitting diode, an inorganic light emitting diode, a quantum dot/well light emitting diode, or the like. For example, the first pixel PXsx of FIG. 2 is exemplarily shown to include one light emitting element LD. However, embodiments are not limited thereto. For example, in another embodiment, the first pixel PXsx may also include a plurality of light emitting elements connected in series, in parallel, or in series-parallel.

The first, second, fifth, sixth, and seventh transistors T1, T2, T5, T6, and T7 may be P-type transistors. Channels of the first, second, fifth, sixth, and seventh transistors T1, T2, T5, T6, and T7 may be a poly silicon transistor formed of poly silicon. The poly silicon transistor may be a low temperature poly silicon (LTPS) transistor. The poly silicon transistor may have high electron mobility, and thus have a fast driving characteristic.

The third and fourth transistors T3 and T4 may be N-type transistors. Channels of the third and fourth transistors T3 and T4 may be an oxide semiconductor transistor formed of an oxide semiconductor. The oxide semiconductor transistor may be processed at a low temperature and have low charge mobility compared to the poly silicon transistor. Thus, an amount of a leakage current of the oxide semiconductor transistors, which is generated in a turn-off state, may be less than that of the poly silicon transistors.

Figure 3:
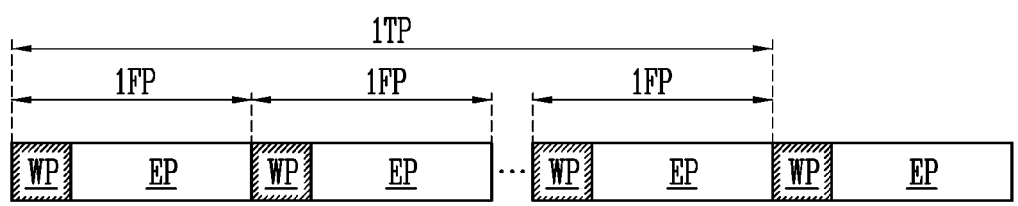
FIG. 3 is a diagram illustrating a high image frequency driving method of driving the display device of FIG. 1.

FIG. 3 is a diagram illustrating a high image frequency driving method according to an embodiment.

When the entire area or a partial area of the pixel unit 50 displays image frames at a first image frequency (or a first image rate), it may be expressed that a corresponding area is operated in a first display mode. In addition, when the entire area or a partial area of the pixel unit 50 displays image frames at a second image frequency (or a second image rate) lower than the first image frequency, it may be expressed that a corresponding area is operated in a second display mode.

In the first display mode, the corresponding area of the pixel unit 50 may display image frames at 20 Hz or higher, for example, 60 Hz. In the second display mode, the corresponding area of the pixel unit 50 may display image frames at less than 20 Hz, for example, 1 Hz. The second display mode may be a low power display mode. A period 1TP is an arbitrarily defined period for comparing the first display mode and the second display mode. The period 1TP may mean the same time interval in the first display mode and the second display mode.

In the first display mode, the period 1TP may include a plurality of frame periods 1FP. In the first display mode, each of the frame periods 1FP may sequentially include a data write period WP and an emission period EP. Here, each of the periods 1TP, 1FP, WP, and EP may be defined for each pixel row.

Therefore, during the period 1TP for each pixel row, the pixel may display a plurality of image frames corresponding to the number of frame periods 1FP based on the data voltages received in the data write periods WP.

Figure 4:
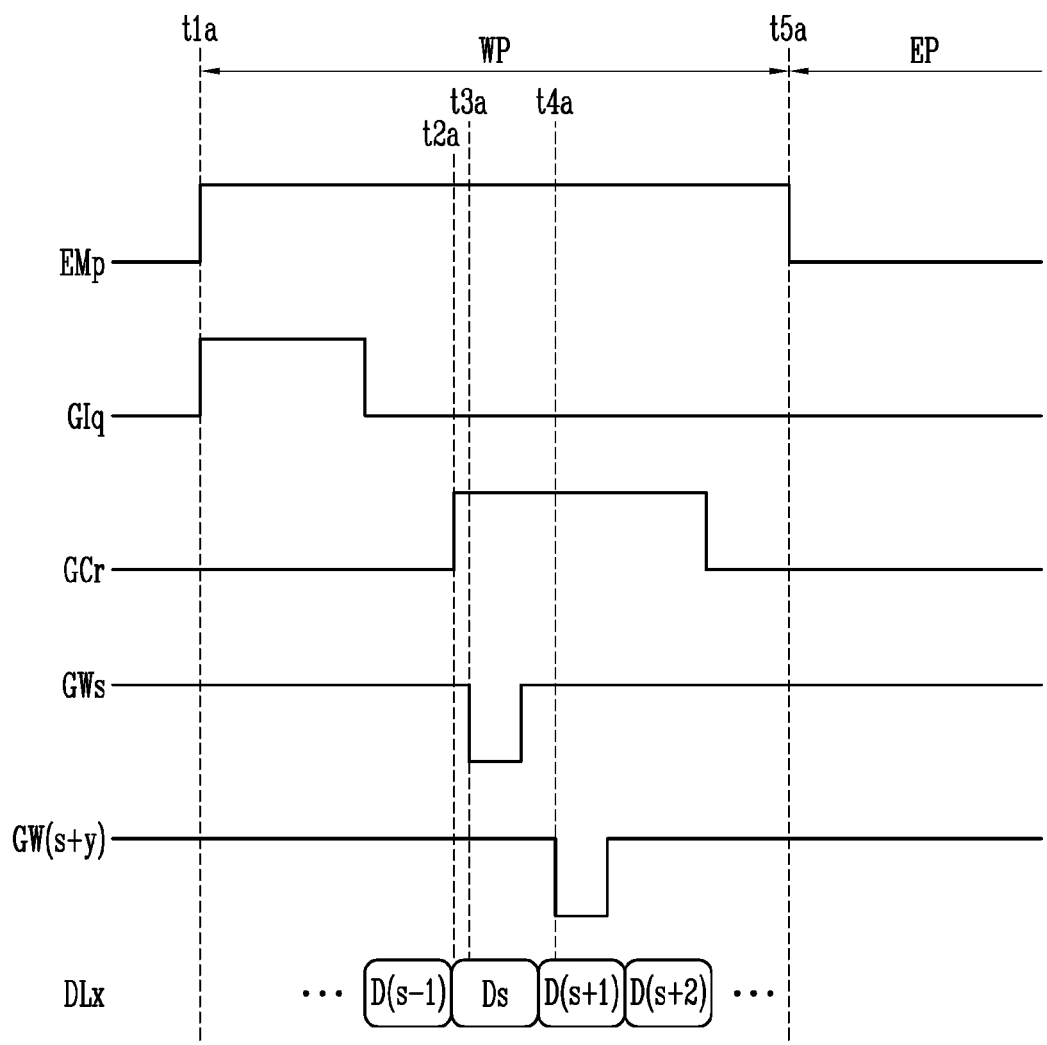
FIG. 4 is a diagram illustrating an operation during a data write period in the high image frequency driving method of FIG. 3.

FIG. 4 is a diagram illustrating a data write period according to an embodiment.

Referring to FIG. 4, a method of driving the data write period WP and the emission period EP for the first pixel PXsx is illustrated. Since substantially the same driving method is applied to the second pixel PXwx, a repetitive description is omitted for descriptive convenience.

At a time point t1a, an emission signal of a turn-off level (for example, a logic high level) may be applied to the emission line EMp. Accordingly, the fifth transistor T5 and the sixth transistor T6 may be turned off, and the light emitting element LD may be in a non-emission state.

In addition, at the time point t1a, the first scan signal of the turn-on level (for example, a logic high level) may be applied to the first scan line GIq. Accordingly, the fourth transistor T4 may be turned on, and the first node N1 and the first initialization line VINTL1 may be electrically connected to each other. Accordingly, the first node N1 may be initialized to a first initialization voltage of the first initialization line VINTL1. The first initialization voltage may be sufficiently lower than a voltage of the second node N2. Therefore, the first transistor T1 may be on-biased, and a hysteresis phenomenon, which is caused by a grayscale level of a previous frame period, may be prevented or minimized.

At a time point t2a, the second scan signal of the turn-on level (for example, a logic high level) may be applied to the second scan line GCr. Accordingly, the third transistor is turned on, and the first transistor T1 may be connected in a diode form.

At a time point t3a, the third scan signal of the turn-on level (for example, a logic low level) may be applied to the third scan lines GWs. Accordingly, the second transistor T2 may be turned on, and the data line DLx and the second node N2 may be electrically connected to each other. Data voltages D(s−1), Ds, D(s+1), and D(s+2) corresponding to each pixel row may be sequentially applied to the data line DLx, and at the time point t3a, the data voltage Ds corresponding to the first pixel PXsx may be applied to the data line DLx. A magnitude of the data voltage Ds may correspond to a grayscale level of the first pixel PXsx. The data voltage Ds may be applied to the gate electrode of the first transistor T1 sequentially passing through the second transistor T2, the first transistor T1, and the third transistor T3 of the first pixel PXsx. At the time point t3a, the voltage applied to the gate electrode of the first transistor T1 is a compensated data voltage Ds, which is decreased from the data voltage Ds by a threshold voltage of the first transistor T1. The compensated data voltage Ds may be maintained by the capacitor Cst.

At a time point t4a, the third scan signal of the turn-on level (for example, the logic low level) may be applied to the third scan line GW(s+y). Accordingly, the seventh transistor T7 may be turned on, and the second initialization line VINTL2 and the first electrode of the light emitting element LD may be connected to each other. For example, the second initialization voltage may be a sufficiently low voltage, and accordingly, an expression of a black grayscale level or a low grayscale level of the light emitting element LD may be easy. For example, the second initialization voltage may be the same as or less than the voltage of the second power line ELVSSL.

At a time point t5a, the emission signal of the turn-on level (for example, a logic low level) may be applied to the emission line EMp. Accordingly, the fifth transistor T5 and the sixth transistor T6 may be turned on, and the light emitting element LD may be in a light emitting state.

Figure 5:
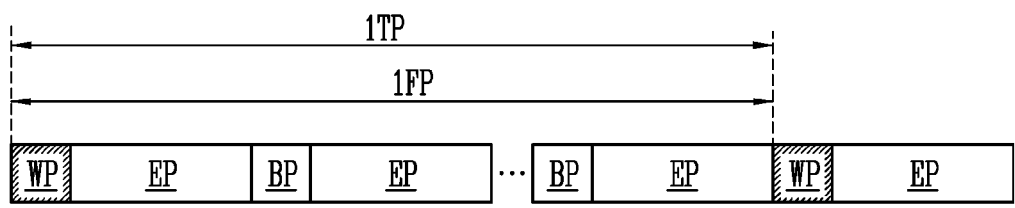
FIG. 5 is a diagram illustrating a low image frequency driving method of driving the display device of FIG. 1.

FIG. 5 is a diagram illustrating a low image frequency driving method according to an embodiment.

In the second display mode, the period 1TP and the one frame period 1FP may have the same length. In the second display mode, each of the frame periods 1FP may sequentially include the data write period WP, the emission period EP, a bias refresh period BP, and the emission period EP.

Since the third and fourth transistors T3 and T4 of the first pixel PXsx maintain a turn-off state in the bias refresh periods BP, the capacitor Cst may maintain the same data voltage during one frame period 1FP. In particular, since the third and fourth transistors T3 and T4 are formed as oxide semiconductor transistors, a leakage current may be minimized.

Therefore, the first pixel PXsx may display the same single image frame during the period 1TP based on the data voltage Ds supplied in the data write period WP.

Figure 6:
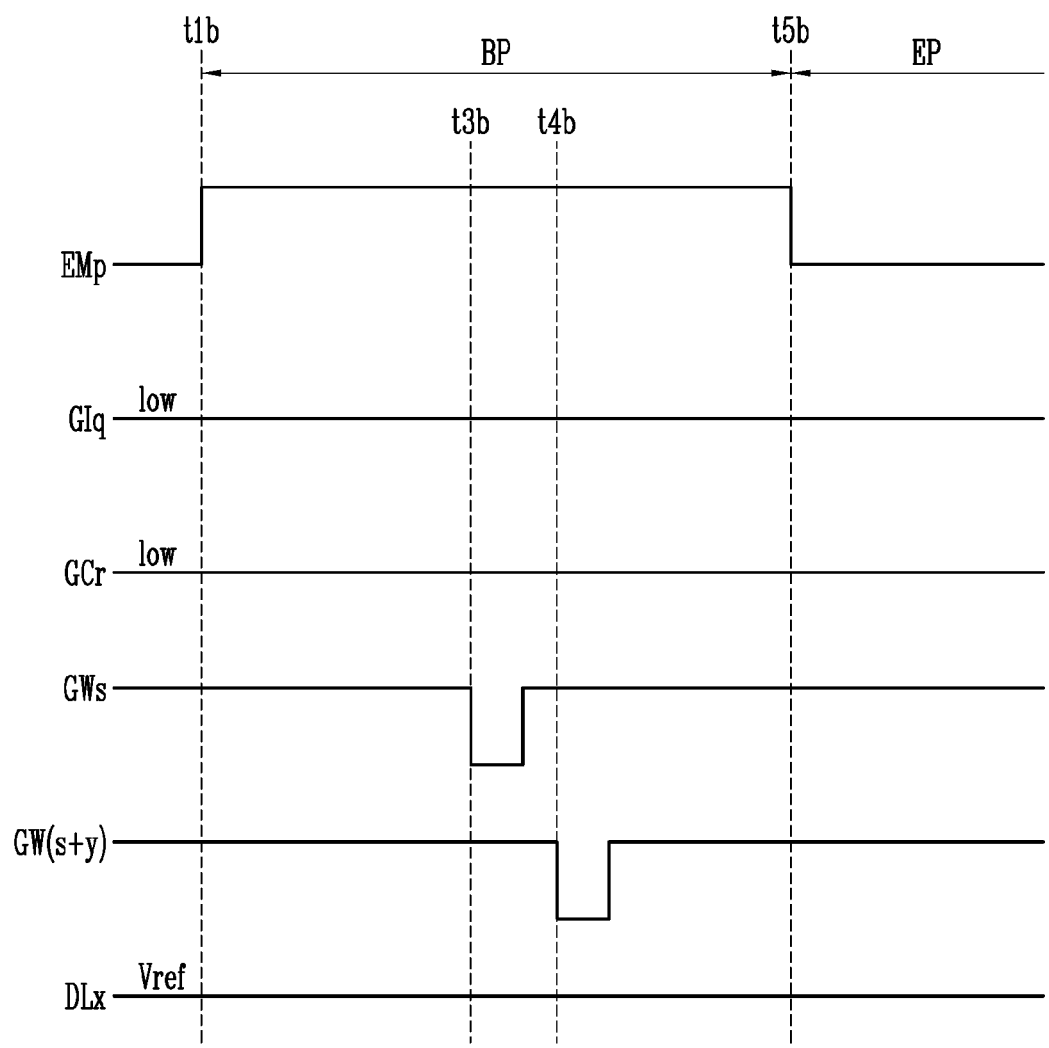
FIG. 6 is a diagram illustrating an operation during a bias refresh period of the low image frequency driving method of FIG. 5.

FIG. 6 is a diagram illustrating a bias refresh period according to an embodiment.

Time points t1b, t3b, t4b, and t5b of FIG. 6 may correspond to the time points t1a, t3a, t4a, and t5a of FIG. 4, respectively. Signals applied to the emission line EMp and the third scan lines GWs and GW(s+y) may be the same as described with reference to FIG. 4. Therefore, since a light output waveform of the light emitting element LD during the low image frequency driving is similar to that of the high image frequency driving, flicker may not be recognized by a user.

During the bias refresh period BP, scan signals of a turn-off level (for example, a logic low level) may be maintained at the first scan line GIq and the second scan line GCr. Accordingly, a voltage of the first node N1 may be maintained during one frame period 1FP.

During the bias refresh period BP, the data line DLx may be maintained as a reference voltage Vref. For another example, the data voltage may not be supplied or the data voltage of a different voltage level independent of the grayscale level of the first pixel PXsx may be supplied.

Figure 7:
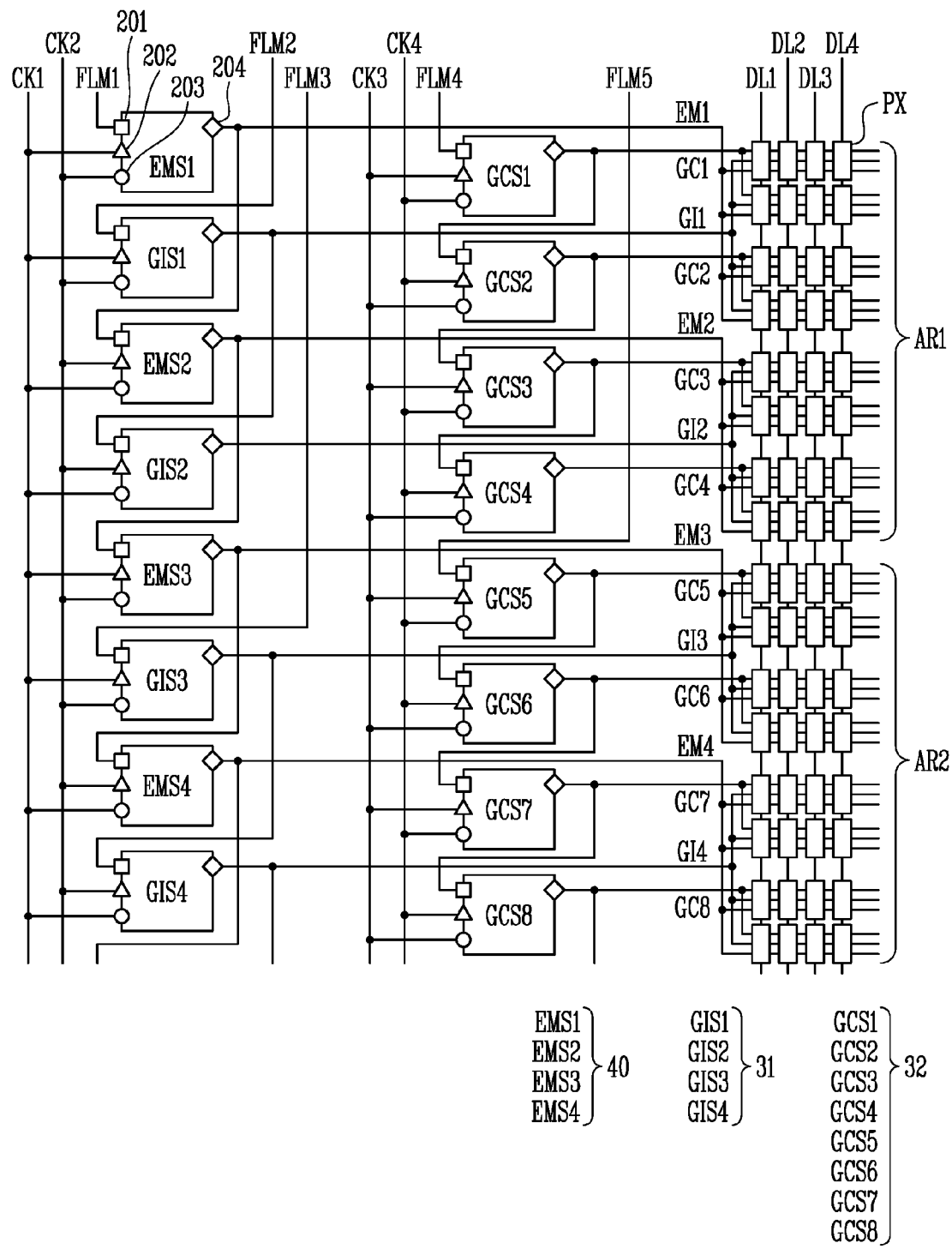
FIG. 7 is a schematic diagram of an emission driver, a first scan driver, and a second scan driver of the display device of FIG. 1.

FIG. 7 is a diagram illustrating an emission driver, a first scan driver, and a second scan driver according to an embodiment.

Referring to FIG. 7, the emission driver 40 may include a plurality of emission stages EMS1, EMS2, EMS3, and EMS4. Each of the plurality of emission stages EMS1, EMS2, EMS3, and EMS4 may be connected to N pixel rows. N may be an integer greater than 3. For example, N may be 4 in an example of FIG. 7. At this time, an output terminal 204 of the emission stage EMS1 may be connected to four pixel rows through the emission line EM1. Similarly, each of output terminals 204 of the emission stages EMS2, EMS3, and EMS4 may be connected to four pixel rows through the emission lines EM2, EM3, and EM4.

Each of the emission stages EMS1, EMS2, EMS3, and EMS4 may include a first input terminal 201, a second input terminal 202, a third input terminal 203, and the output terminal 204. The first input terminal 201 of the first emission stage EMS1 may be connected to a first start line FLM1. The other emission stages EMS2, EMS3, and EMS4 may be respectively connected to the output terminals 204 of previous emission stages. The second input terminal 202 and the third input terminal 203 of the emission stages EMS1, EMS2, EMS3, and EMS4 may be alternately connected to a first clock line CK1 and a second clock line CK2. For example, when the second input terminal 202 of the first emission stage EMS1 is connected to the first clock line CK1 and the third input terminal 203 is connected to the second clock line CK2, the second input terminal 202 of the next emission stage EMS2 may be connected to the second clock line CK2 and the third input terminal 203 may be connected to the first clock line CK1.

The first scan driver 31 may include a plurality of first scan stages GIS1, GI52, GIS3, and GI54. Each of the plurality of first scan stages GIS1, GIS2, GI53, and GIS4 may be connected to N pixel rows. For example, N may be 4 in the example of FIG. 7. At this time, the output terminal 204 of the first scan stage GIS1 may be connected to four pixel rows through the first scan line GI1. Similarly, each of output terminals 204 of the first scan stages GI52, GIS3, and GIS4 may be connected to four pixel rows through the first scan lines GI2, GI3, and GI4. At this time, the first scan line GI1 and the emission line EM1 may be connected to the same pixel rows. Similarly, each of the first scan lines GI2, GI3, and GI4 and the emission lines EM2, EM3, and EM4 may be connected to the same pixel rows.

Each of the first scan stages GIS1, GIS2, GIS3, GIS4 may include a first input terminal 201, a second input terminal 202, a third input terminal 203, and the output terminal 204. The first circuit unit may refer to a group of the first scan stages GIS1 and GIS2 connected to the pixels PX of the first area AR1. The first input terminal 201 of the first scan stage GIS1 of the first circuit unit may be connected to a second start line FLM2. The other first scan stages GIS2 may be respectively connected to the output terminals 204 of previous first scan stages. The second circuit unit may refer to a group of the first scan stages GIS3 and GIS4 connected to the pixels PX of the second area AR2. The first input terminal 201 of the first scan stage GIS3 of the second circuit unit may be connected to a third start line FLM3. The other first scan stages GIS4 may be respectively connected to the output terminals 204 of previous first scan stages.

The second input terminal 202 and the third input terminal 203 of the first scan stages GIS1, GIS2, GIS3, and GIS4 may be alternately connected to the first clock line CK1 and the second clock line CK2. For example, when the second input terminal 202 of the first scan stage GIS1 is connected to the first clock line CK1 and the third input terminal 203 is connected to the second clock line CK2, the second input terminal 202 of the next first scan stage GIS2 may be connected to the second clock line CK2 and the third input terminal 203 may be connected to the first clock line CK1.

The second scan driver 32 may include a plurality of second scan stages GCS1, GCS2, GCS3, GCS4, GCS5, GCS6, GCS7, and GCS8. Each of the plurality of second scan stages GCS1 to GCS8 may be connected to M pixel rows. M may be an integer greater than 1 and less than N. For example, M may be N/2. For example, M may be 2 in the example of FIG. 7. At this time, the output terminal 204 of the second scan stage GCS1 may be connected to two pixel rows through the second scan line GC1. Similarly, each of the output terminals 204 of the second scan stages GCS2 to GCS8 may be connected to two pixel rows through the second scan lines GC2 to GC8.

Each of the second scan stages GCS1 to GCS8 may include a first input terminal 201, a second input terminal 202, a third input terminal 203, and the output terminal 204. The third circuit unit may refer to a group of the second scan stages GCS1, GCS2, GCS3, and GCS4 connected to the pixels PX of the first area AR1. The first input terminal 201 of the first second scan stage GCS1 of the third circuit unit may be connected to a fourth start line FLM4. The other second scan stages GCS2, GCS3, and GCS4 may be respectively connected to the output terminals 204 of previous second scan stages. The fourth circuit unit may refer to a group of the second scan stages GCS5, GCS6, GCS7, and GCS8 connected to the pixels PX of the second area AR2. The first input terminal 201 of the first second scan stage GCS5 of the fourth circuit unit may be connected to a fifth start line FLM5. The other second scan stages GCS6, GCS7, and GCS8 may be respectively connected to the output terminals 204 of previous second scan stages.

The second input terminal 202 and the third input terminal 203 of the second scan stages GCS1 to GCS8 may be alternately connected to a third clock line CK3 and a fourth clock line CK4. For example, when the second input terminal 202 of the second scan stage GCS1 is connected to the third clock line CK3 and the third input terminal 203 is connected to the fourth clock line CK4, the second input terminal 202 of the next second scan stage GCS2 may be connected to the fourth clock line CK4 and the third input terminal 203 may be connected to the third clock line CK3.

According to the embodiment of FIG. 7, partial areas of the pixel unit 50 may be easily set according to the scan stages to which the third start line FLM3 and the fifth start line FLM5 are connected to each other. For reference, the prior method of partially turning off a voltage of a high level power line VHNL without adding a separate start line may not divide the pixel unit 50 into three or more partial areas (refer to FIG. 8). According to an embodiment, the pixel unit 50 may be divided into three or more partial areas by adding start lines.

In addition, in a typical/general method, the first scan signals are generated by the second scan stages GCS1 to GCS8. In this case, dummy stages and carry lines are additionally required, and thus there is a disadvantage that a dead space increases. However, in the embodiment of FIG. 7, compared to the typical/general method, the number of emission stages EMS1 to EMS4 may be reduced by half (i.e., 50%) to secure a space, and a dead space may be reduced by disposing the first scan stages GIS1 to GIS4 in the secured space. At this time, a channel width of buffer transistors P10 and P11 of each of the emission stages EMS1 to EMS4 may be required to be increased, but since a channel width of buffer transistors of the second scan stages GCS1 to GCS8 is reduced, such that dead spaces, which are caused by the emission stages EMS1 to EMS4 and the second scan stages GCS1 to GCS8, may be offset by each other.

Figure 8:
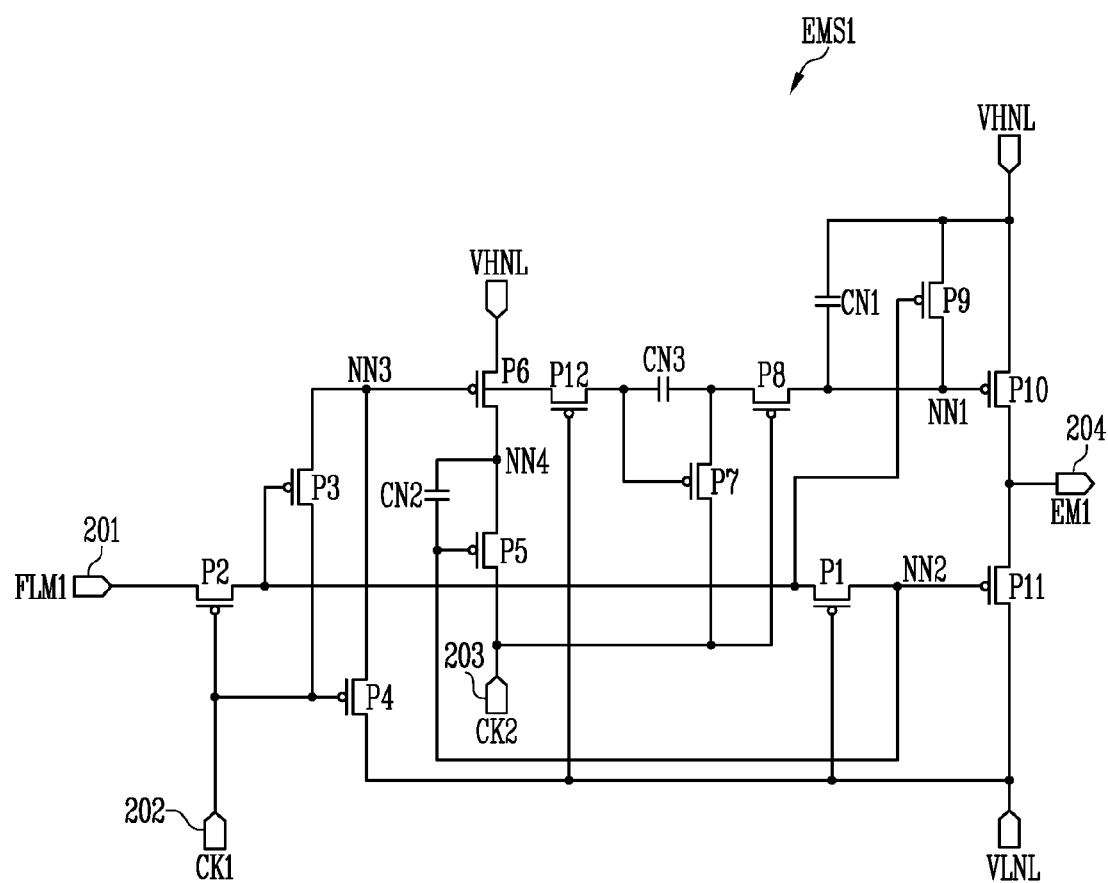
FIG. 8 is a schematic diagram of an emission stage of the emission driver of FIG.

FIG. 8 is a diagram illustrating an emission stage according to an embodiment.

Configurations of the emission stages EMS1 to EMS4, the first scan stages GIS1 to GIS4, and the second scan stages GCS1 to GCS8 may be substantially the same. Therefore, hereinafter, the disclosure is described based on the emission stage EMS1, and a repeated description is omitted for descriptive convenience.

The emission stage EMS1 may include transistors P1 to P12 and capacitors CN1 to CN3. The transistors P1 to P12 may be P-type transistors.

The transistor P1 may have a first electrode connected to a node NN2, a second electrode connected to a first electrode of the transistor P2, and a gate electrode connected to a low level power line VLNL.

The transistor P2 may have a first electrode connected to the second electrode of the transistor P1, a second electrode connected to the first start line FLM1, and a gate electrode connected to the first clock line CK1.

The transistor P3 may have a first electrode connected to a node NN3, a second electrode connected to the first clock line CK1, and a gate electrode connected to the first electrode of the transistor P2.

The transistor P4 may have a first electrode connected to the node NN3, a second electrode connected to the low level power line VLNL, and a gate electrode connected to the first clock line CK1.

The transistor P5 may have a first electrode connected to a node NN4, a second electrode connected to the second clock line CK2, and a gate electrode connected to the node NN2.

The transistor P6 may have a first electrode connected to the high level power line VHNL, a second electrode connected to the node NN4, and a gate electrode connected to the node NN3.

The transistor P7 may have a first electrode connected to a first electrode of the capacitor CN3, a second electrode connected to the second clock line CK2, and a gate electrode connected to a second electrode of the capacitor CN3.

The transistor P8 may have a first electrode connected to a node NN1, a second electrode connected to the first electrode of the capacitor CN3, and a gate electrode connected to the second clock line CK2.

The transistor P9 may have a first electrode connected to the high level power line VHNL, a second electrode connected to the node NN1, and a gate electrode connected to the node NN2.

The transistor P10 may have a first electrode connected to the high level power line VHNL, a second electrode connected to the emission line EM1, and a gate electrode connected to the node NN1.

The transistor P11 may have a first electrode connected to the emission line EM1, a second electrode connected to the low level power line VLNL, and a gate electrode connected to the node NN2.

The transistor P12 may have a first electrode connected to the second electrode of the capacitor CN3, a second electrode connected to the node NN3, and a gate electrode connected to the low level power line VLNL.

The capacitor CN1 may have a first electrode connected to the high level power line VHNL and a second electrode connected to the node NN1.

The capacitor CN2 may have a first electrode connected to the node NN4 and a second electrode connected to the node NN2.

The capacitor CN3 may have the first electrode connected to the first electrode of the transistor P7 and the second electrode connected to the gate electrode of the transistor P7.

Figure 9:
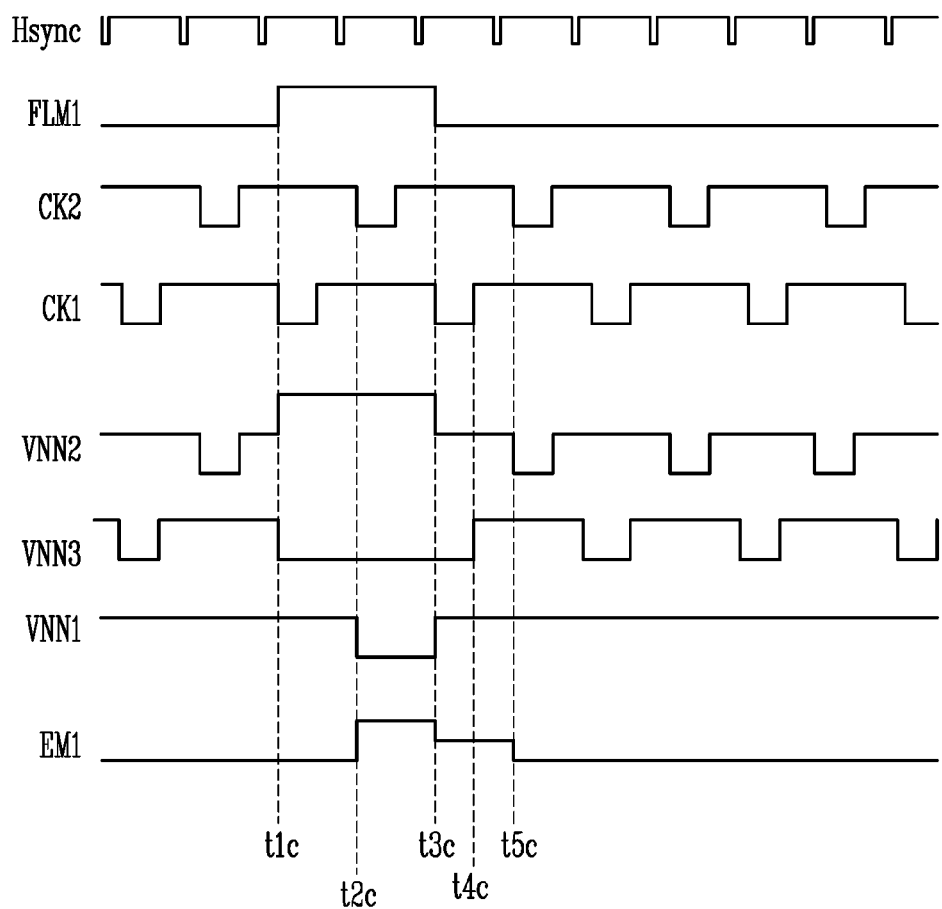
FIG. 9 is a timing diagram illustrating a method of driving the emission stage of FIG. 8.

FIG. 9 is a diagram illustrating a method of driving the emission stage of FIG. 8.

Referring to FIG. 9, a timing diagram for the first start signal applied to the first start line FLM1, the second clock signal applied to the second clock line CK2, the first clock signal applied to the first clock line CK1, a node voltage VNN2 of the node NN2, a node voltage VNN3 of the node NN3, a node voltage VNN1 of the node NN1, and the emission signal applied to the emission line EM1 is shown. At this time, the horizontal synchronization signal Hsync is shown as a reference signal for timing. An interval between pulses of the horizontal synchronization signal Hsync may be referred to as one horizontal period.

A high level voltage may be applied to the high level power line VHNL and a low level voltage may be applied to the low level power line VLNL. In describing the driving method, since the transistors P12 and P1 having the gate electrode connected to the low level power line VLNL are turned on during most of a period, a description of the transistors P12 and P1 is omitted except for a special case.

First, at a time point t1c, the first start signal of a turn-off level (for example, a logic high level) may be supplied to the first start line FLM1, and the first clock signal of a logic low level may be supplied to the first clock line CK1. Therefore, the transistors P2 and P4 may be turned on.

When the transistor P2 is turned on, the high level first start signal of a high level is transmitted to the node NN2, and the node voltage VNN2 becomes the high level. The transistors P3, P5, P9, and P11 may be turned off by the node voltage VNN2 of the high level.

When the transistor P4 is turned on, since the node NN3 and the low level power line VLNL are connected to each other, the node voltage VNN3 may become a low level. The transistors P6 and P7 may be turned on by the node voltage VNN3 of the low level.

When the transistor P6 is turned on, the node NN4 and the high level power line VHNL may be connected to each other. Therefore, since the high level power line VHNL supports one end of the capacitor CN2, the node voltage VNN2 of the node NN2 may be stably maintained.

When the transistor P7 is turned on, the first electrode of the capacitor CN3 and the second clock line CK2 may be connected to each other. At this time, since the second clock signal of a high level is applied to the gate electrode of the transistor P8, the transistor P8 may be in a turn-off state, and thus the node voltage VNN1 may not change.

At a time point t2c, the second clock signal of a logic low level may be supplied to the second clock line CK2.

The second clock signal of the logic low level may be supplied to the first electrode of the capacitor CN3 through the transistor P7. At this time, a voltage, which is lower than the low level, may be applied to the gate electrode of the transistor P7 by a capacitive coupling of the capacitor CN3. Therefore, the transistor P7 may stably maintain a turn-on state, and a driving characteristic thereof may be improved.

According to an embodiment, the node voltage VNN3 may not be affected by the capacitive coupling of the capacitor CN3 due to the transistor P12. When a voltage, which is lower than the low level, may be applied to the first electrode of the transistor P12 due to the capacitive coupling of the capacitor CN3, the first electrode of the transistor P12 functions as a drain electrode. Therefore, the node NN3 corresponding to the second electrode of the transistor P12 functions as a source electrode. In addition, since a low level voltage is applied to the gate electrode of the transistor P12 through the low level power line VLNL, a voltage, which is higher than the low level, may be required to be applied to the source electrode of the transistor P12 so that the transistor P12 is turned on. At this point, since the node voltage VNN3 of the node NN3 has a low level, the transistor P12 may be in a turn-off state.

Therefore, according to an embodiment, since the node voltage VNN3 is maintained by the transistor P12, an excessive bias voltage may be prevented from being applied to the transistors P3 and P4, and a lifespan of the transistors P3 and P4 may be extended.

In addition, the transistor P8 may be turned on by the second clock signal of the logic low level. Therefore, the node NN1 and the second clock line CK2 may be connected through the transistors P7 and P8. Accordingly, the transistor P10 may be turned on by the node voltage VNN1 of the logic low level. For reference, at this time, the transistor P9 may maintain the turn-off state by the node voltage VNN2 of the logic high level.

The high level power line VHNL and the emission line EM1 may be connected through the transistor P10 turned-on. Therefore, a voltage of a logic high level may be supplied to the emission line EM1 as the emission signal of a logic high level.

At a time point t3c, the first clock signal of the logic low level is supplied to the first clock line CK1. Therefore, the transistor P4 may be turned on, and since the node NN3 may be connected to the low level power line VLNL, the node voltage VNN3 may maintain the logic low level. In addition, the transistor P2 may be turned on and the first start signal of a logic low level may be supplied to the node NN2. Therefore, the transistors P3, P5, P9, and P11 may be turned on. Accordingly, the transistor P10 may be diode-connected, and thus the voltage of the logic high level of the high level power line VHNL may not be transmitted to the emission line EM1. At this time, the voltage of the logic low level of the low level power line VLNL may be transmitted to the emission line EM1 through the transistor P11 turned-on.

At a time point t4c, the first clock signal of the logic high level may be supplied to the first clock line CK1. At this time, since the transistor P3 is turned on, the node voltage VNN3 increases. Accordingly, the transistors P6 and P7 may be turned off.

At a time point t5c, the second clock signal of the logic low level may be supplied to the second clock line CK2. At this time, since the transistor P5 is turned on, the node voltage VNN2 drops to a level lower than the logic low level due to a capacitive coupling of the capacitor CN2. Therefore, the transistor P11 may stably maintain a turn-on state and a driving characteristic thereof may be improved.

According to an embodiment, the node corresponding to the second electrode of the transistor P1 may not be affected by the capacitive coupling of the capacitor CN2 due to the transistor P1. When a voltage, which is lower than the low level, may be applied to the node NN2 which is the first electrode of the transistor P1 by the capacitive coupling of the capacitor CN2, the first electrode of the transistor P1 functions as a drain electrode. Therefore, the node corresponding to the second electrode of the transistor P1 functions as a source electrode. In addition, since a low level voltage is applied to the gate electrode of the transistor P1 through the low level power line VLNL, a voltage higher than the low level is required to be applied to the source electrode of the transistor P1 so that the transistor P1 is turned on. At this point, since a low level voltage is applied to the source electrode of the transistor P1, the transistor P1 may be in a turn-off state.

Therefore, according to an embodiment, since the voltage of the node corresponding to the second electrode of the transistor P1 may be maintained by the transistor P1, an excessive bias voltage may be prevented from being applied to the transistors P2 and P3, and thus a lifespan of the transistors P2 and P3 may be extended.

Figure 10:
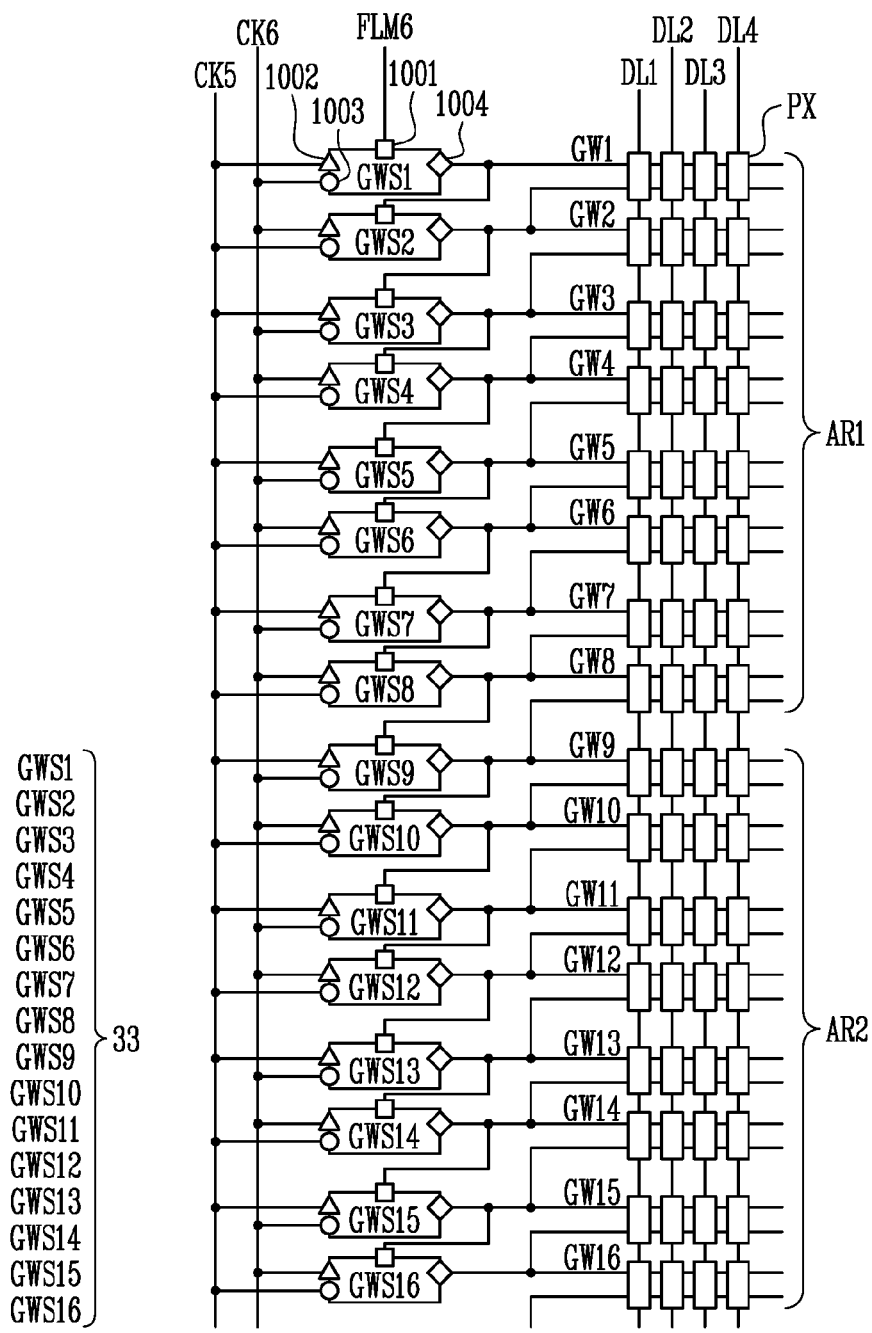
FIG. 10 is a schematic diagram of a third scan driver of the display device of FIG.

FIG. 10 is a diagram illustrating a third scan driver according to an embodiment.

For reference, pixels PX of FIG. 10 are the substantially same as the pixels PX of FIG. 7.

Referring to FIG. 10, the third scan driver 33 may include a start stage GWS1 and a plurality of third scan stages GWS2, GWS3, GWS4, GWS5, GWS6, GWS7, GWS8, GWS9, GWS10, GWS11, GWS12, GWS13, GWS14, GWS15, and GWS16. Each of the plurality of third scan stages GWS2 to GWS16 may be connected to K number of pixel rows. For example, K may be 2 in an example of FIG. 10. Alternatively, the start stage GWS1 may be connected to one pixel row. The number of third scan stages GWS2 to GWS16 may be greater than the number of second scan stages GCS1 to GCS8. For example, the number of third scan stages GWS2 to GWS16 may correspond to an integer multiple (e.g., twice) of the number of second scan stages GCS1 to GCS8.

An output terminal 1004 of the third scan stage GWS2 may be connected to two pixel rows through a third scan line GW2. Similarly, each of the output terminals 1004 of the third scan stages GWS3 to GWS16 may be connected to two pixel rows through the third scan lines GW3 to GW16.

Each of the third scan stages GWS1 to GWS16 may include a first input terminal 1001, a second input terminal 1002, a third input terminal 1003, and the output terminal 1004. The first input terminal 1001 of the start stage GWS1 may be connected to a sixth start line FLM6. The first input terminals 1001 of the other third scan stages GWS2 to GWS16 may be respectively connected to the output terminals 1004 of the previous third scan stages. The second input terminal 1002 and the third input terminal 1003 of the third scan stages GWS1 to GWS16 may be alternately connected to a fifth clock line CK5 and a sixth clock line CK6. For example, when the second input terminal 1002 of the start stage GWS1 is connected to the fifth clock line CK5 and the third input terminal 1003 is connected to the sixth clock line CK6, the second input terminal 1002 of the next third scan stage GWS2 may be connected to the sixth clock line CK6 and the third input terminal 1003 may be connected to the fifth clock line CK5.

Figure 11:
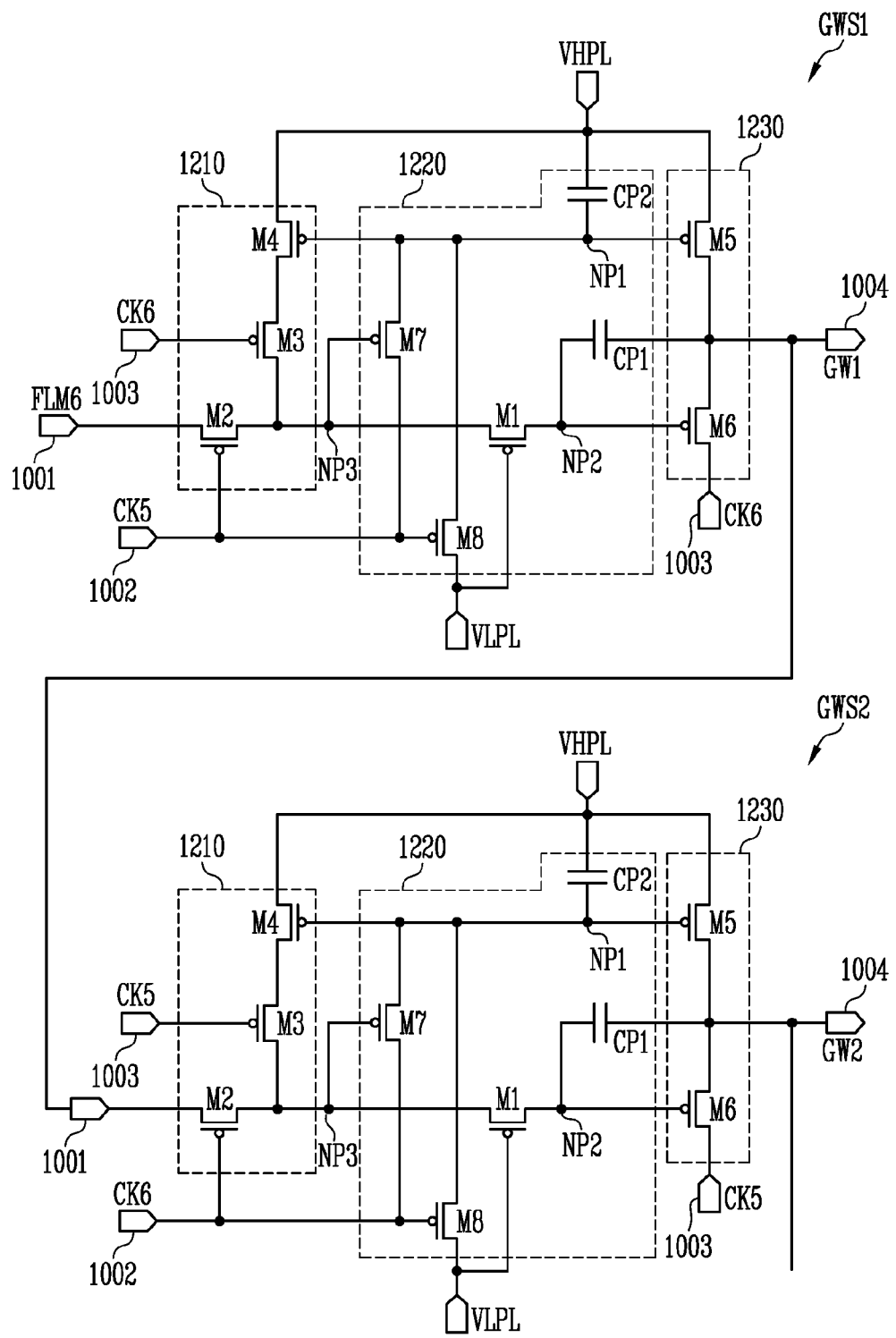
FIG. 11 is a schematic diagram of a third scan stage of the third scan driver of FIG. 10.

FIG. 11 is a diagram illustrating a third scan stage according to an embodiment.

In FIG. 11, for convenience of description, a start stage GWS1 and a third scan stage GWS2 are shown. Referring to FIG. 11, the start stage GWS1 may include a first driver 1210, a second driver 1220, and an output unit (e.g., buffer) 1230.

The output unit 1230 may control a voltage supplied to the output terminal 1004 in response to voltages of the nodes NP1 and NP2. For example, the output unit 1230 may include a transistor M5 and a transistor M6.

The transistor M5 may be positioned between a high level power line VHPL and the output terminal 1004, and may have a gate electrode connected to the node NP1. The transistor M5 may control a connection between the high level power line VHPL and the output terminal 1004 in response to a voltage applied to the node NP1.

The transistor M6 may be positioned between output terminal 1004 and the third input terminal 1003, and may have a gate electrode connected to the node NP2. The transistor M6 may control a connection between the output terminal 1004 and the third input terminal 1003 in response to a voltage applied to the node NP2. The output unit 1230 may be driven as a buffer. Additionally, the transistor M5 and the transistor M6 may be configured by connecting a plurality of transistors in parallel. The transistors M5 and M6 may be referred to as buffer transistors.

The first driver 1210 may control a voltage of the node NP3 in response to signals supplied to the first, second, and third input terminals 1001, 1002, and 1003. For example, the first driver 1210 may include transistors M2 to M4.

The transistor M2 may be positioned between the first input terminal 1001 and the node NP3, and may have a gate electrode connected to the second input terminal 1002. The transistor M2 may control a connection between the first input terminal 1001 and the node NP3 in response to a signal supplied to the second input terminal 1002.

The transistor M3 and transistor M4 may be connected in series between the node NP3 and the high level power line VHPL. The transistor M3 may be positioned between the transistor M4 and the node NP3, and may have a gate electrode connected to the third input terminal 1003. The transistor M3 may control a connection between the transistor M4 and the node NP3 in response to a signal supplied to the third input terminal 1003.

The transistor M4 may be positioned between the transistor M3 and the high level power line VHPL, and may have a gate electrode connected to the node NP1. The transistor M4 may control a connection between the transistor M3 and the high level power line VHPL in response to the voltage of the node NP1.

The second driver 1220 may control the voltage of the node NP1 in response to a voltage of the second input terminal 1002 and the node NP3. For example, the second driver 1220 may include a transistor M7, a transistor M8, a capacitor CP1, and a capacitor CP2.

The capacitor CP1 may be connected between the node NP2 and the output terminal 1004. The capacitor CP1 may charge a voltage corresponding to turning-on and turning-off of the transistor M6.

The capacitor CP2 may be connected between the node NP1 and the high level power line VHPL. The capacitor CP2 may charge the voltage applied to the node NP1.

The transistor M7 may be positioned between the node NP1 and the second input terminal 1002, and may have a gate electrode connected to the node NP3. The transistor M7 may control a connection between the node NP1 and the second input terminal 1002 in response to the voltage of the node NP3.

The transistor M8 may be positioned between the node NP1 and the low level power line VLPL, and may have a gate electrode connected to the second input terminal 1002. The transistor M8 may control a connection between the node NP1 and the low level power line VLPL in response to a signal of the second input terminal 1002.

The transistor M1 may be positioned between the node NP3 and the node NP2, and may have a gate electrode connected to the low level power line VLPL. The transistor M1 may maintain an electrical connection between the node NP3 and the node NP2 while maintaining the turn-on state. Additionally, the transistor M1 may limit an amount of a voltage drop of the node NP3 in response to the voltage of the node NP2. In other words, even though the voltage of the node NP2 drops to a voltage, which is lower than a voltage of the low level power line VLPL, the voltage of the node NP3 may not be lower than a voltage obtained by subtracting a threshold voltage of the transistor M1 from the voltage of the low level power line VLPL.

Figure 12:
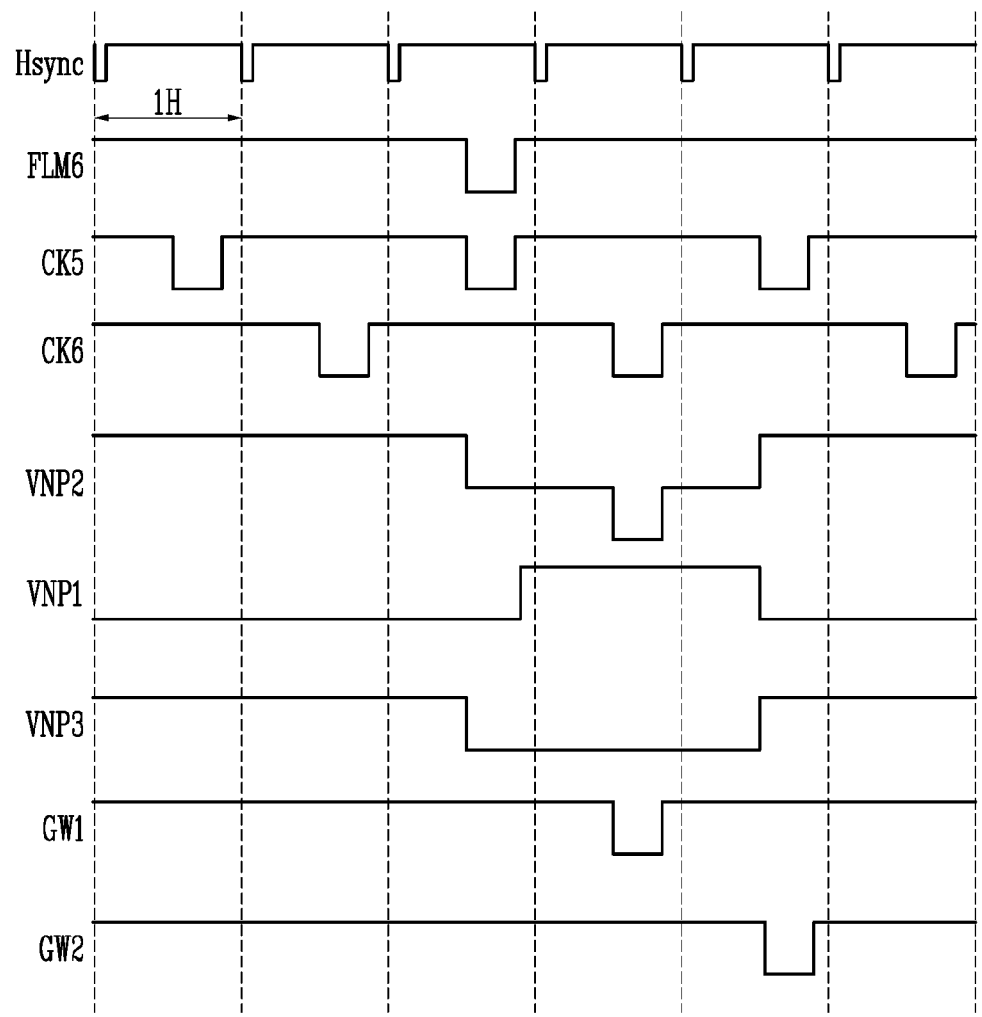
FIG. 12 is a timing diagram illustrating a method of driving the third scan stage of FIG. 11.

FIG. 12 is a diagram illustrating a method of driving the third scan stage of FIG. 11.

In FIG. 12, for convenience of description an operation process is described using the start stage GWS1.

Referring to FIG. 12, the fifth clock signal of the fifth clock line CK5 and the sixth clock signal of the sixth clock line CK6 have a period of two horizontal periods 2H and are supplied in different horizontal periods. In other words, the sixth clock signal may be set to a signal shifted by half a period (e.g., one horizontal period) from the fifth clock signal. In addition, the sixth start signal of the sixth start line FLM6 supplied to the first input terminal 1001 may be supplied to be synchronized with the fifth clock signal supplied to the second input terminal 1002.

Supplying specific signals may mean that the specific signals have a turn-on level (e.g., a logic low level). Stopping the supply of the specific signals may mean that the clock specific signals have a turn-off level (e.g., a logic high level).

Additionally, when the sixth start signal is supplied to the sixth start line FLM6, the first input terminal 1001 may be set to a voltage of a logic low level, and when the sixth start signal is not supplied to the sixth start line FLM6, the first input terminal 1001 may be set to a voltage of a logic high level. In addition, when a clock signal is supplied to the second input terminal 1002 and the third input terminal 1003, the second input terminal 1002 and the third input terminal 1003 may be set to a voltage of a logic low level, and when the clock signal is not supplied, the second input terminal 1002 and the third input terminal 1003 may be set to a voltage of a logic high level.

An operation process is described in detail. First, the sixth start signal may be supplied to be synchronized with the fifth clock signal.

When the fifth clock signal is supplied to the fifth clock line CK5, the transistor M2 and the transistor M8 may be turned on. When the transistor M2 is turned on, the first input terminal 1001 and the node NP3 may be electrically connected to each other. Here, since the transistor M1 is set to a turn-on state in most of periods, the node NP2 may maintain an electrical connection with the node NP3.

When the first input terminal 1001 and the node NP3 are electrically connected to each other, voltages VNP2 and VNP3 of the node NP3 and the node NP2 may be set to a logic low level by the sixth start signal supplied to the first input terminal 1001. When the voltages VNP2 and VNP3 of the node NP3 and the node NP2 are set to the logic low level, the transistor M6 and the transistor M7 may be turned on.

When the transistor M6 is turned on, the third input terminal 1003 and the output terminal 1004 may be electrically connected to each other. Here, the third input terminal 1003 may be set to a voltage of a logic high level (e.g., the sixth clock signal may not be supplied), and thus a voltage of a logic high level may be also output to the output terminal 1004. When the transistor M7 is turned on, the second input terminal 1002 and the node NP1 may be electrically connected to each other. According to the fifth clock signal supplied to the second input terminal 1002, the voltage VNP1 of the node NP1 may be set to a logic low level.

Additionally, when the fifth clock signal is supplied to the fifth clock line CK5, the transistor M8 may be turned on. When the transistor M8 is turned on, the voltage of the low level power line VLPL is supplied to the node NP1. Here, the voltage of the low level power line VLPL may be set to the same (or similar) voltage to the logic low level of the fifth clock signal, and thus the node NP1 may stably maintain a voltage of a logic low level.

When the node NP1 is set to the voltage of the logic low level, the transistor M4 and the transistor M5 may be turned on. When the transistor M4 is turned on, the high level power line VHPL and the transistor M3 may be electrically connected to each other. Here, since the transistor M3 is set to a turn-off state, even though the transistor M4 is turned on, the node NP3 may stably maintain a voltage of a low level. When the transistor M5 is turned on, the voltage of the high level power line VHPL may be supplied to the output terminal 1004. Here, the voltage of the high level power line VHPL may be set to the same (or similar) voltage to the voltage of the logic high level supplied to the third input terminal 1003, and thus the output terminal 1004 may stably maintain a voltage of a logic high level.

Thereafter, the supply of the sixth start signal and the fifth clock signal may be stopped. When the supply of the fifth clock signal is stopped, the transistor M2 and the transistor M8 may be turned off. At this time, in response to the voltage stored in the capacitor CP1, the transistor M6 and the transistor M7 may maintain a turn-on state. For example, the node NP2 and the node NP3 may maintain a voltage of a logic low level by the voltage stored in the capacitor CP1.

When the transistor M6 maintains the turn-on state, the output terminal 1004 and the third input terminal 1003 may maintain an electrical connection. When the transistor M7 maintains the turn-on state, the node NP1 may maintain an electrical connection with the second input terminal 1002. Here, a voltage of the second input terminal 1002 may be set to a voltage of a logic high level in response to the stop of the supply of the fifth clock signal, and thus the node NP1 may be also set to a voltage of a logic high level. When the voltage of the logic high level is supplied to the node NP1, the transistor M4 and the transistor M5 may be turned off.

Thereafter, the sixth clock signal may be supplied to the third input terminal 1003. At this time, since the transistor M6 is set to a turn-on state, the sixth clock signal supplied to the third input terminal 1003 may be supplied to the output terminal 1004. In this case, the output terminal 1004 may output the sixth clock signal as the third scan signal of the turn-on level to the third scan line GW1.

For example, when the sixth clock signal is supplied to the output terminal 1004, the voltage of the node NP2 drops to a voltage, which is lower than that of the low level power line VLPL by the capacitive coupling of the capacitor CP1, and thus the transistor M6 may stably maintain the turn-on state.

For example, even though the voltage of the node NP2 drops, the node NP3 may maintain an approximate voltage (for example, the voltage obtained by subtracting the threshold voltage of the transistor M1 from the voltage of the low level power line VLPL) by the transistor M1.

After the third scan signal of the turn-on level is output to the third scan line GW1, the supply of the sixth clock signal may be stopped. When the supply of the sixth clock signal is stopped, the output terminal 1004 may output a voltage of a logic high level. In addition, the voltage VNP2 of the node NP2 may rise to an approximate voltage of the low level power line VLPL in response to the voltage of the logic high level of the output terminal 1004.

Thereafter, the fifth clock signal may be supplied. When the fifth clock signal may be supplied to the fifth clock line CK5, the transistor M2 and the transistor M8 may be turned on. When the transistor M2 is turned on, the first input terminal 1001 and the node NP3 may be electrically connected to each other. At this time, the sixth start signal may not be supplied to the first input terminal 1001, and thus the first input terminal 1001 may be set to a voltage of a high level. Therefore, when the transistor M1 is turned on, a voltage of a logic high level may be supplied to the node NP3 and the node NP2, and thus the transistor M6 and the transistor M7 may be turned off.

When the transistor M8 is turned on, the voltage of the low level power line VLPL may be supplied to the node NP1, and thus the transistor M4 and the transistor M5 may be turned on. When the transistor M5 is turned on, the voltage of the high level power line VHPL may be supplied to the output terminal 1004. Thereafter, the transistor M4 and the transistor M5 may maintain a turn-on state in response to the voltage charged in the capacitor CP2, and thus the output terminal 1004 may stably receive the voltage of the high level power line VHPL.

Additionally, when the sixth clock signal is supplied, the transistor M3 may be turned on. At this time, since the transistor M4 is set to a turn-on state, the voltage of the high level power line VHPL may be supplied to the node NP3 and the node NP2. In this case, the transistor M6 and the transistor M7 may stably maintain a turn-off state.

Next, the third scan stage GWS2 may receive an output signal (e.g., the third scan signal) of the start stage GWS1 to be synchronized with the sixth clock signal. In this case, the third scan stage GWS2 may output the third scan signal of the turn-on level to the third scan line GW2 to be synchronized with the fifth clock signal. The third scan stages GWS3 to GWS16 may sequentially output the third scan signals of the turn-on level to the scan lines GW3 to GW16 while repeating the above-described process.

Figure 13:
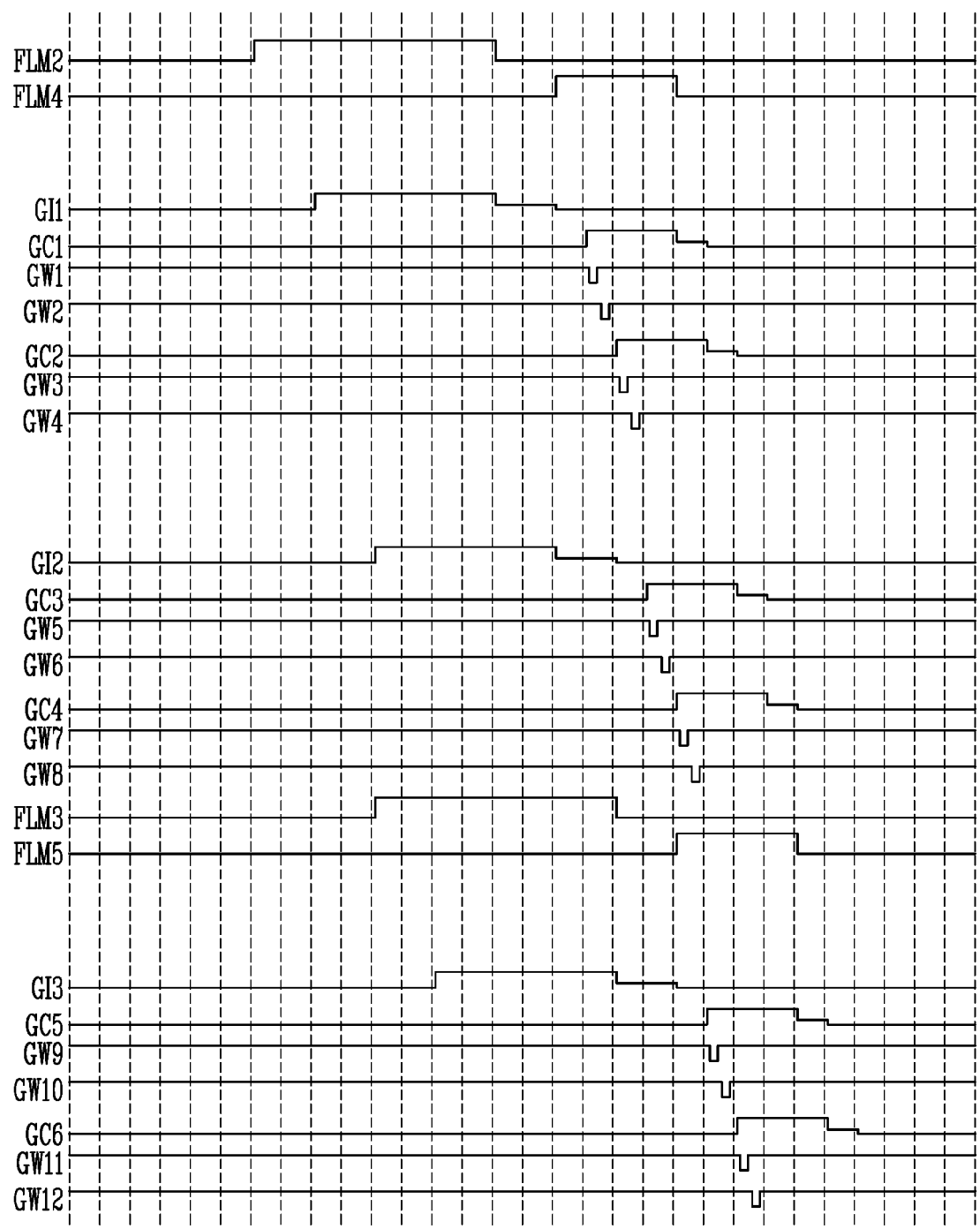
FIGS. 13 and 14 are timing diagrams illustrating a case in which a first area and a second area are controlled to display images at different image frequencies.
Figure 14:
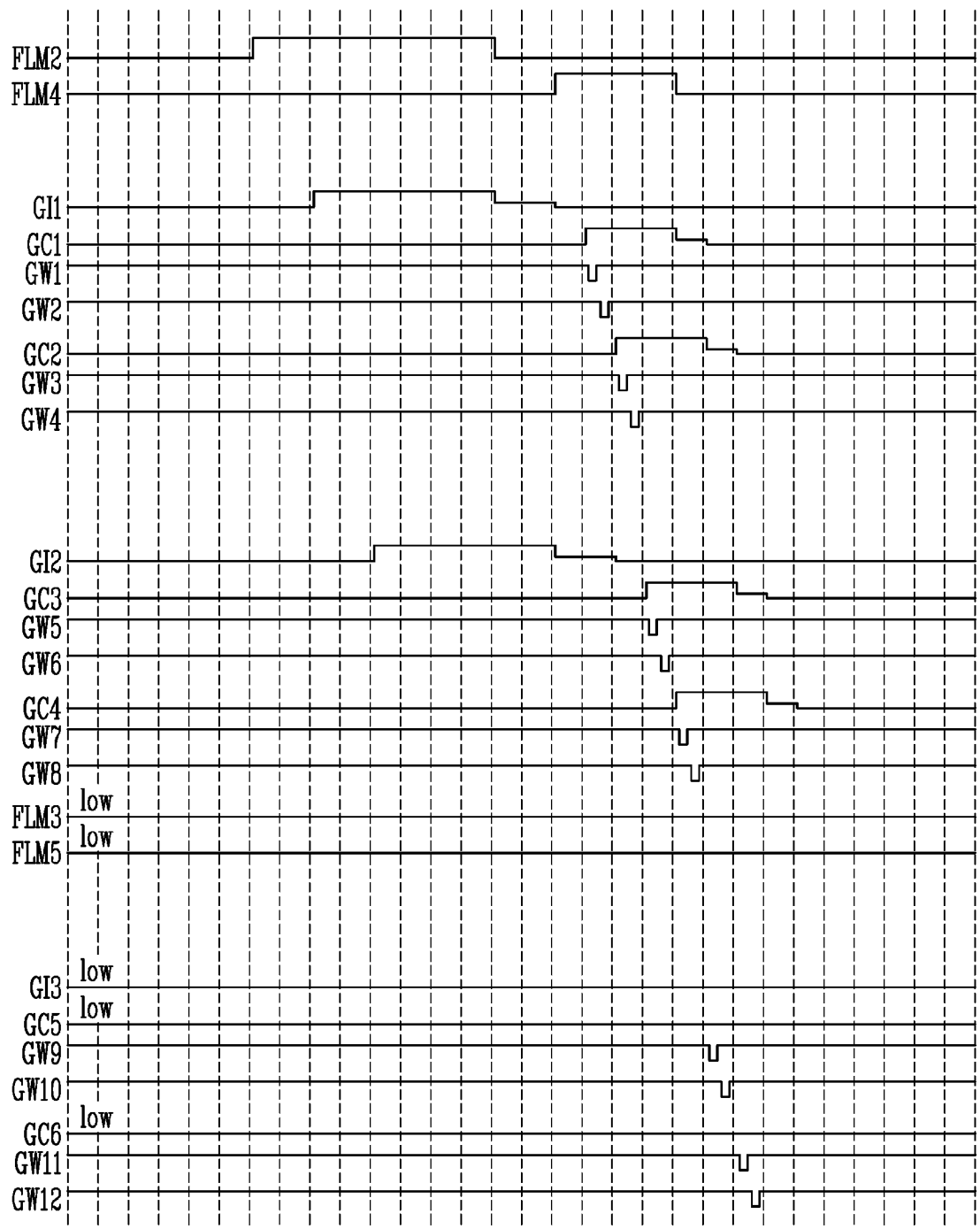

FIGS. 13 and 14 are diagrams illustrating a case in which the first area and the second area display an image at different image frequencies.

In FIGS. 13 and 14, a case in which the first area AR1 is driven in the first display mode (e.g., at the high image frequency) and the second area AR2 is driven in the second display mode (e.g., at the low image frequency) is described as an example.

FIG. 13 shows a timing diagram during the data write periods WP of the pixel rows of the first area AR1 and the second area AR2 (refer to FIGS. 3 and 4). During the data write periods WP, the third start signal and the fifth start signal may be supplied to the third start line FLM3 and the fifth start line FLM5 at an appropriate timing to allow the first scan signal and the second scan signal of an appropriate timing may be supplied to the first scan lines GI3 and the second scan lines GC5 and GC6 of the second area AR2. The description of FIGS. 4 and 9 are referred to regarding the appropriate timing.

Referring to FIG. 14, a timing diagram of a case in which the data write periods WP of the pixel rows proceed in the first area AR1 and the bias refresh periods BP of the pixel rows proceed in the second area AR2 is shown. In FIG. 14, the third start line FLM3 and the fifth start line FLM5 may be maintained at a voltage of a turn-off level (for example, a logic low level) to maintain the first scan lines GI3 and the second scan lines GC5 and GC6 of the second area AR2 as the voltage of the turn-off level.

Referring to FIGS. 13 and 14, when the first area AR1 and the second area AR2 display the images at different image frequencies, cycles of the second start signal and the third start signal may be different from each other. For example, as in the case of FIGS. 13 and 14, when the first area AR1 is driven in the first display mode and the second area AR2 is driven in the second display mode, the cycle of the second start signal may be shorter than the cycle of the third start signal. For example, when the first area AR1 is driven in the second display mode and the second area AR2 is driven in the first display mode, the cycle of the second start signal may be longer than the cycle of the third start signal.

In addition, when the first area AR1 and the second area AR2 display the images at different image frequencies, cycles of the fourth start signal and the fifth start signal may be different from each other. For example, as in the case of FIGS. 13 and 14, when the first area AR1 is driven in the first display mode and the second area AR2 is driven in the second display mode, the cycle of the fourth start signal is shorter than the cycle of the fifth start signal. For example, when the first area AR1 is driven in the second display mode and the second area AR2 is driven in the first display mode, the cycle of the fourth start signal may be longer than the cycle of the fifth start signal.

Further, the first area AR1 and the second area AR2 may display an image at the same image frequency. At this time, the cycles of the second start signal and the third start signal may be the same as each other. In addition, the cycles of the fourth start signal and the fifth start signal may be the same as each other.

Figure 15:
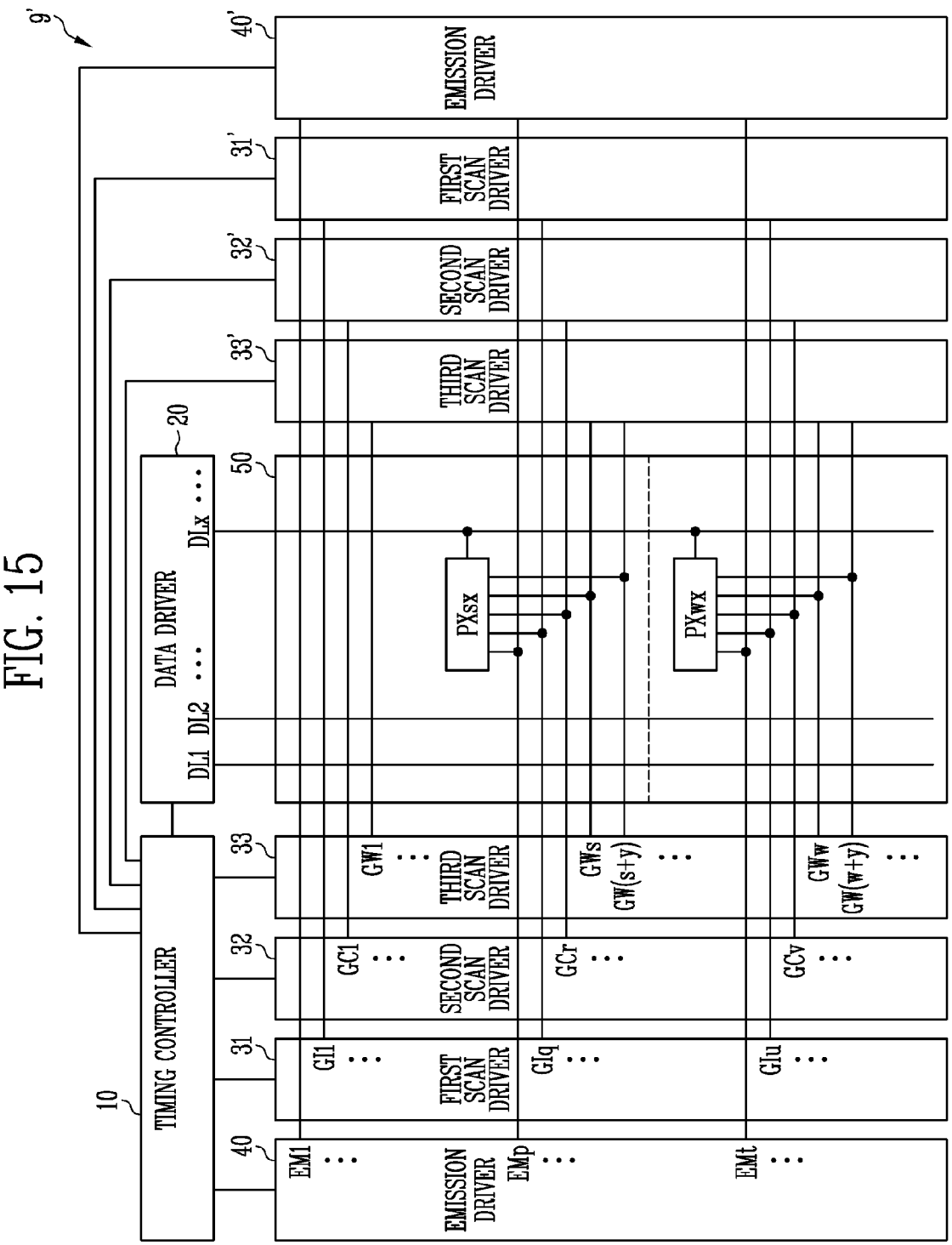
FIG. 15 is a schematic diagram of another embodiment of the display device FIG.

FIG. 15 is a diagram illustrating a display device according to another embodiment.

Referring to FIG. 15, the display device 9' is different from the display device 9 in that the display device 9' further includes an emission driver 40', a first scan driver 31', a second scan driver 32', and a third scan driver 33'.

When an RC delay is improved or a notch or a hole exists in the pixel unit 50, the emission driver 40', the first scan driver 31', the second scan driver 32', and the third scan driver 33' may be additionally disposed.

Figure 16:
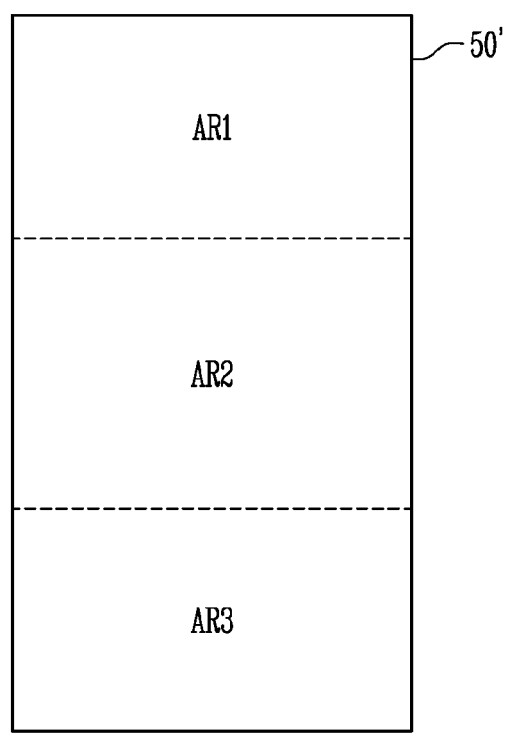
FIG. 16 is a schematic diagram of a pixel unit according to another embodiment.

FIG. 16 is a diagram illustrating a pixel unit according to another embodiment.

Referring to FIG. 16, the pixel unit 50' is different from the pixel unit 50 of FIG. 1 in that the pixel unit 50' includes three or more areas AR1, AR2, and AR3.

Such a configuration may be implemented by disposing additional start lines in each of the first scan driver 31 and the second scan driver 32. Each of the three or more areas AR1, AR2, and AR3 may be freely driven in the first display mode, the second display mode, and the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a pixel unit comprising first pixels disposed in a first area and second pixels disposed in a second area;
an emission driver configured to sequentially supply emission signals of a turn-off level to the first pixels and the second pixels based on a first start signal, a first clock signal, and a second clock signal; and
a first scan driver configured to sequentially supply first scan signals of a turn-on level to the first pixels based on a second start signal, the first clock signal, and the second clock signal, and sequentially supply the first scan signals of the turn-on level to the second pixels based on a third start signal, the first clock signal, and the second clock signal, wherein the emission driver and the first scan driver share the first clock signal and the second clock signal,
wherein a plurality of emission stages of the emission driver and a plurality of first scan stages of the first scan driver have substantially a same circuit configuration and are alternately arranged.

2. The display device of claim 1, further comprising:
a second scan driver configured to sequentially supply second scan signals of a turn-on level to the first pixels based on a fourth start signal, a third clock signal, and a fourth clock signal, and sequentially supply the second scan signals of the turn-on level to the second pixels based on a fifth start signal, the third clock signal, and the fourth clock signal.

3. The display device of claim 2, further comprising:
a third scan driver configured to sequentially supply third scan signals of a turn-on level to the first pixels and the second pixels based on a sixth start signal, a fifth clock signal, and a sixth clock signal.

4. The display device of claim 3, wherein each of the first pixels and the second pixels comprises:
a first transistor having a gate electrode connected to a first node, a first electrode connected to a second node, and a second electrode connected to a third node;
a second transistor having a gate electrode to receive one of the third scan signals, a first electrode connected to a data line, and a second electrode connected to the second node;
a third transistor having a gate electrode to receive one of the second scan signals, a first electrode connected to the first node, and a second electrode connected to the third node;
a fourth transistor having a gate electrode to receive one of the first scan signals, a first electrode connected to the first node, and a second electrode connected to a first initialization line; and
a fifth transistor having a gate electrode to receive one of the emission signals, a first electrode connected to a first power line, and a second electrode connected to the second node.

5. The display device of claim 4, wherein each of the first pixels and the second pixels further comprises:
a sixth transistor having a gate electrode to receive one of the emission signals, a first electrode connected to the third node, and a second electrode;
a seventh transistor having a gate electrode to receive one of the third scan signals, a first electrode connected to a second initialization line, and a second electrode;
a light emitting element having a first electrode connected to the second electrode of the sixth transistor and the second electrode of the seventh transistor, and a second electrode connected to a second power line; and
a capacitor having a first electrode connected to the first power line and a second electrode connected to the first node.

6. The display device of claim 5, wherein:
the first transistor, the second transistor, the fifth transistor, the sixth transistor, and the seventh transistor are P-type transistors, and
the third transistor and the fourth transistor are N-type transistors.

7. The display device of claim 3, wherein:
each of the plurality of emission stages is connected to N pixel rows, wherein N is an integer greater than 3.

8. The display device of claim 7, wherein:
each of the plurality of first scan stages is connected to the N pixel rows.

9. The display device of claim 8, wherein:
the second scan driver comprises a plurality of second scan stages, and
each of the plurality of second scan stages is connected to M pixel rows, wherein M is an integer greater than 1 and less than N.

10. The display device of claim 9, wherein:
the third scan driver comprises a start stage and a plurality of third scan stages,
each of the plurality of third scan stages is connected to the M pixel rows, and
a number of the third scan stages is greater than a number of the second scan stages.

11. The display device of claim 2, wherein when the first area and the second area display images at a same image frequency, cycles of the fourth start signal and the fifth start signal are same as each other.

12. The display device of claim 11, wherein when the first area and the second area display images at different image frequencies, the cycles of the fourth start signal and the fifth start signal are different from each other.

13. The display device of claim 1, wherein when the first area and the second area display images at a same image frequency, cycles of the second start signal and the third start signal are same as each other.

14. The display device of claim 13, wherein when the first area and the second area display images at different image frequencies, the cycles of the second start signal and the third start signal are different from each other.

15. A display device comprising:
a pixel unit comprising a plurality of pixel rows;
an emission driver comprising a plurality of emission stages each connected to N pixel rows, wherein N is an integer greater than 3;
a first scan driver comprising a plurality of first scan stages each connected to the N pixel rows;
a second scan driver comprising a plurality of second scan stages each connected to M pixel rows, wherein M is an integer greater than 1 and less than N; and
a third scan driver comprising a start stage and a plurality of third scan stages each connected to the M pixel rows,
wherein the plurality of emission stages and the plurality of first scan stages have substantially a same circuit configuration and are alternately arranged.

16. The display device of claim 15, wherein a number of the third scan stages is greater than a number of the second scan stages.

17. The display device of claim 16, wherein the start stage of the third scan driver is connected to one pixel row.

18. The display device of claim 15, wherein the emission driver is to receive a first start signal, a first clock signal, and a second clock signal.

19. The display device of claim 18, wherein the first scan driver is to receive a second start signal, a third start signal, the first clock signal, and the second clock signal and/or second scan driver is to receive a fourth start signal, a fifth start signal, a third clock signal, and a fourth clock signal.

20. The display device of claim 19, wherein the stages of the emission driver are disposed in between the stages of one of the first, second and third scan drivers.

* * * * *